(12) United States Patent
Tanaka et al.

(10) Patent No.: US 8,809,935 B2
(45) Date of Patent: Aug. 19, 2014

(54) SEMICONDUCTOR DEVICE AND METHOD FOR MANUFACTURING THE SAME

(75) Inventors: Masayuki Tanaka, Yokohama (JP); Kenichiro Toratani, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 203 days.

(21) Appl. No.: 13/423,818

(22) Filed: Mar. 19, 2012

(65) Prior Publication Data
US 2013/0119531 A1 May 16, 2013

(30) Foreign Application Priority Data
Nov. 15, 2011 (JP) ................................. 2011-250045
Feb. 8, 2012 (JP) ................................. 2012-025015

(51) Int. Cl.
*H01L 29/66* (2006.01)
*H01L 27/115* (2006.01)

(52) U.S. Cl.
CPC ................ *H01L 27/11578* (2013.01)
USPC ........... 257/319; 257/324; 257/316; 257/320; 438/257; 438/593

(58) Field of Classification Search
CPC ................... H01L 27/11578; H01L 27/11563; H01L 27/115; H01L 27/11551; H01L 29/7923; H01L 29/7926; H01L 29/792; H01L 29/4234; H01L 21/28282; H01L 29/42344; H01L 29/66833; H01L 29/66787; H01L 27/11529; H01L 29/7887
USPC ......... 257/314, 315, 316, 317, 319, 320, 321, 257/324, 329, 296, 390; 438/688, 261, 257, 438/264, 591, 201, 211, 266, 593
See application file for complete search history.

(56) References Cited

U.S. PATENT DOCUMENTS

| 8,008,707 | B2 | 8/2011 | Matsuo et al. | |
| 2009/0189213 | A1 | 7/2009 | Matsuo et al. | |
| 2010/0140682 | A1* | 6/2010 | Kamioka et al. | ............... 257/319 |
| 2011/0298039 | A1 | 12/2011 | Matsuo et al. | |
| 2011/0303969 | A1* | 12/2011 | Kai et al. | ....................... 257/324 |
| 2012/0119283 | A1* | 5/2012 | Lee et al. | ....................... 257/316 |

FOREIGN PATENT DOCUMENTS

JP 2009-170781 7/2009

OTHER PUBLICATIONS

U.S. Appl. No. 13/597,337, filed Aug. 29, 2012, Tanaka, et al.
U.S. Appl. No. 13/233,788, filed Sep. 15, 2011, Kenicihiro Toratani, et al.
Dennis Hausmann, et al., "Rapid Vapor Deposition of Highly Conformal Silica Nanolaminates", Science, vol. 298, Oct. 11, 2002, 6 pages.

* cited by examiner

*Primary Examiner* — Thanh Y Tran
(74) *Attorney, Agent, or Firm* — Oblon, Spivak, McClelland, Maier & Neustadt, L.L.P.

(57) ABSTRACT

According to one embodiment, a method for manufacturing a semiconductor device includes: forming an underlayer film that contains atoms selected from the group consisting of aluminum, boron and alkaline earth metal; and forming a silicon oxide film on the underlayer film by a CVD method or an ALD method by use of a silicon source containing at least one of an ethoxy group, a halogen group, an alkyl group and an amino group, or a silicon source of a siloxane system.

5 Claims, 20 Drawing Sheets

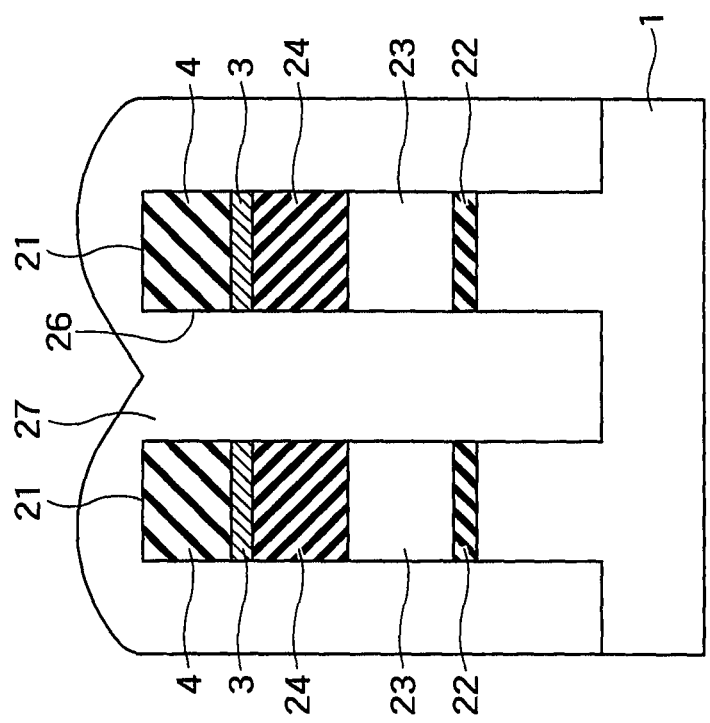

SEMICONDUCTOR DEVICE AND METHOD FOR MANUFACTURING THE SAME

CROSS-REFERENCE TO RELATED APPLICATION

This application is based upon and claims the benefit of priority from prior Japanese Patent Application No. 2011-250045, filed on Nov. 15, 2011, and, prior Japanese Patent Application No. 2012-25015, filed on Feb. 8, 2012, the entire contents of which are incorporated herein by reference.

FIELD

Embodiments of the present invention relate to a semiconductor device and a method for manufacturing the same.

BACKGROUND

In a semiconductor device and a method for manufacturing the same, a silicon oxide film is used in a variety of applications. For example, the silicon oxide film has been in use as a side wall protective member, an interwire insulating member, a cell insulating member, or the like.

However, with a finer pattern and a greater packing density of a semiconductor device, an area and a volume of a place using a silicon oxide film in the semiconductor device increase, and hence there is an increase in proportion of the time taken for a process of depositing the silicon oxide film in manufacturing the semiconductor device. Therefore, for the purpose of reducing the time for manufacturing the semiconductor device, it is desirable to reduce the time taken for a silicon-oxide-film forming process itself. Naturally, the silicon oxide film is required to have favorable insulation characteristics and the like.

BRIEF DESCRIPTION OF THE DRAWINGS

FIGS. 8A to 8E are views for explaining a method for manufacturing a semiconductor memory device according to a second embodiment;

DETAILED DESCRIPTION

In one embodiment, a method for manufacturing a semiconductor device includes: forming an underlayer film that contains atoms selected from the group consisting of aluminum, boron and alkaline earth metal; and forming a silicon oxide film on the underlayer film by a CVD method or an ALD method by use of a silicon source containing at least one of an ethoxy group, a halogen group, an alkyl group and an amino group, or a silicon source of a siloxane system.

Hereinafter, embodiments will be described with reference to the drawings. However, the present invention is not restricted to these embodiments. It is to be noted that a portion in common throughout the drawings is provided with a common numeral, and a repeated description thereof will be omitted. Further, the drawings are schematic views for explaining the invention and promoting understanding thereof, and some places may each have a shape, a size, a ratio or the like which is different from that of an actual device, but these can be appropriately subjected to design changes in light of the following descriptions and known techniques.

First Embodiment

The present embodiment will be described using FIGS. 1A to 1C. Hereinafter, a description will be provided taking as an example a method for depositing a silicon oxide film 4 on a semiconductor substrate 1 in a manufacturing process for the semiconductor device.

Figure 1A:
FIGS. 1A to 1C are views for explaining a method for manufacturing a semiconductor device according to a first embodiment.

First, the semiconductor substrate 1 is prepared as shown in FIG. 1A. This semiconductor substrate 1 is not restricted to a silicon substrate, but may be another substrate (e.g., a SiGe substrate, etc.). Further, the surface thereof may be formed with a variety of films, a step, a construction such as a semiconductor element, or the like.

Figure 1B:

Next, as shown in FIG. 1B, aluminum atoms are adsorbed onto the surface of the semiconductor substrate 1. Although a description will be hereinafter provided taking the case of adsorbing aluminum atoms as an example, boron atoms or alkaline earth metal such as beryllium, magnesium, calcium, strontium or barium may be adsorbed in place of aluminum atoms.

The film formed by adsorbing atoms may be brought into any state of a metal film, an oxide film, a nitride film, a boride film, a sulfide film and the like, or may be made a mixed film of these. When the film is the oxide film, the nitride film, the boride film or the sulfide film, after adsorption of aluminum atoms or the like, processing as described later will be performed, to form an underlayer film 3. Further, when the underlayer film 3 is the metal film, the nitride film, the boride film or the sulfide film, atoms of aluminum or the like is susceptible to oxidation at the time of depositing a silicon oxide film 4 thereon, thereby to cause the surface of the underlayer film 3 to be oxidized.

Further, although a concentration of atoms of aluminum or the like in the underlayer film 3 will be detailed later, a surface density of the silicon oxide film 4 may be not smaller than 1e12 atoms/cm$^2$ for increasing a deposition rate thereof, and an upper limit of the surface density is not particularly restricted. However, in the case of requiring the silicon oxide film 4 deposited on the underlayer film 3 to have favorable insulating characteristics, the concentration of atoms may be favorably not larger than 1e16 atoms/cm$^2$. For example, when the underlayer film 3 is made up of an aluminum oxide film and intended to have a concentration of aluminum atoms being not smaller than 1e12 atoms/cm$^2$ and not larger than 1e16 atoms/cm$^2$, a film thickness of the underlayer film 3 is on the order of 0.001 nm to 1 nm.

A variety of methods are applicable to a method for adsorbing atoms of aluminum or the like. There are for example applicable an ALD (Atomic Layer Deposition) method such as one described later, a CVD (Chemical Vapor Deposition) method such as one to introduce atom-containing gas into a processing furnace, a PVD (Physical Vapor Deposition) method to adsorb atoms excited by a physical method, an application method such as one to apply an atom-containing solution to the semiconductor substrate 1, a soaking method to soak the semiconductor substrate 1 into an atom-containing solution, and some other method. Further, this adsorption of atoms is preferably performed on a condition where a thin film can be formed, and for example, it is preferably performed in a temperature range of a room temperature to the order of 500° C. The surface adsorption reaction is a competitive reaction between adsorption and desorption of atoms. When a temperature is excessively high, desorption of atoms becomes dominant, thus making it difficult to adsorb atoms with a desired concentration. Further, there may occur a problem such as deterioration in uniformity of an adsorption amount inside the surface due to occurrence of dissolution of a silicon source or occurrence of a CVD reaction. On the other hand, when the temperature is excessively low, there may for example occur a problem in that a reaction caused by an oxidizing agent to the silicon source is weakened and a large amount of organic group in the silicon source is thus left, resulting in that a silicon oxide film having desired electric characteristics cannot ultimately be obtained. It is therefore preferable to adjust an adsorption temperature in accordance with the kind of the silicon source to be used, electric characteristics that the silicon oxide film is required to have, and the like.

More specifically, for example, trimethylaluminium (TMA) is introduced into a depressurized furnace so that aluminum atoms can be adsorbed by the ALD method. Then, in the case of wishing to form the underlayer film 3 of the oxide film, after elimination of TMA inside an atmosphere and purging by means of inert gas, the oxidizing agent is introduced into the furnace so that the underlayer film 3 as shown in FIG. 1B can be obtained. As the oxidizing agent, there can for example be used water, oxygen, ozone, nitrous oxide, radical oxide excited by a physical method, or the like. Hereinafter, a description will be provided taking a case as an example where the underlayer film 3 made of the oxide film is used. In addition, in the case of wishing to form the underlayer film 3 of the nitride film, a nitriding agent may be introduced into the furnace in place of the oxidizing agent. As the nitriding agent, there can for example be used ammonia, hydrazine, radical nitride excited by a physical method, or the like. Similarly, in the case of wishing to form the underlayer film 3 of the boride film, a boron compound such as diborane or boron chloride may be used as a boriding agent, and in the case of wishing to form the underlayer film 3 of the sulfide film, hydrogen sulfide or the like may be used as a sulfiding agent.

Figure 1C:
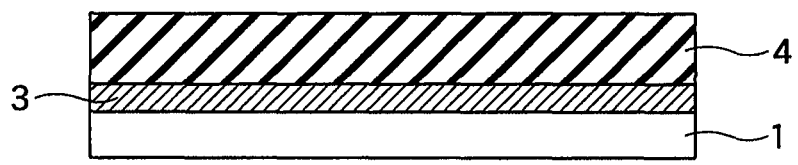

Next, as shown in FIG. 1C, a silicon oxide film 4 is deposited on the underlayer film 3. Although a detail will be described later, depositing the silicon oxide film 4 on the underlayer film 3 can increase the deposition rate of the silicon oxide film 4. The silicon oxide film 4 can be deposited using a silicon source as described below by means of any method of an ALD method to alternately repeat adsorption and oxidation of silicon atoms, a CVD method and a plasma CVD method to supply the silicon source or simultaneously supply the silicon source and the oxidizing agent, and the like.

The silicon oxide film 4 is preferably deposited in a temperature range of a room temperature to the order of 800° C. for avoiding degradation of another film due to heating, and the like. Further, the silicon oxide film 4 may be deposited by discontinuous processing in which the semiconductor substrate 1 formed with the underlayer film 3 is once exposed to the air and the deposition is performed in another furnace, or by continuous processing in which the semiconductor substrate 1 formed with the underlayer film 3 is not exposed to the air but depressed and the deposition is performed in the same furnace, or by continuous processing in which the semiconductor substrate 1 is not exposed to the air and the deposition is performed in a different furnace.

Examples of the silicon source for depositing the silicon oxide film 4 include silane, disilane, a silicon source containing at least one of a halogen group, an ethoxy group, an alkyl group and an amino group, and a silicon source of a siloxane system. Specifically, examples of the silicon source containing the halogen group include dichlorosilane (DCS) and hexachlorodisilane (HCD), examples of one containing the ethoxy group include tetraethoxysilane (TEOS), examples of one containing the amino group include tris(dimethyl aminomethyl)silane, bis(tertiary butylamino)silane (BTBAS) and di(isopropyl amino)silane, and examples of one containing the alkyl group include tetramethylsilane. Examples of the silicon source of the siloxane system include tetramethyl cyclotetrasiloxane and octamethyl cyclotetrasiloxane. Further, examples of the silicon source may also include hexamethyldisilazane, a compound having both the amino group and the alkyl group.

The above cited silicon sources do not contain an OH group, differently from one of a silanol system. Therefore, depositing the film by means of the above cited silicon source can avoid occurrence of many dangling bonds in the silicon oxide film 4, so as to obtain the silicon oxide film 4 of good quality. Further, since the above cited silicon sources are inexpensive, it is possible to suppress cost for manufacturing the semiconductor device. Moreover, in the present embodiment, the silicon oxide film is not deposited by applying a solution of polysilazane or the like (application method), but deposited by the ALD method or the CVD method, whereby it is possible to suppress an amount of carbon in the silicon oxide film 4 as compared with one formed by the application method. For example, in the present embodiment, an amount of carbon in the silicon oxide film 4 can be set to not larger than 1e19 atoms/cm$^3$.

According to the present embodiment, forming the underlayer film that contains atoms of aluminum or the like and depositing the silicon oxide film thereon can increase the deposition rate of the silicon oxide film. It is thus possible to obtain a desired silicon oxide film in a smaller amount of time, and further to reduce the time for manufacturing the semiconductor device. This will be detailed below.

Figure 2:
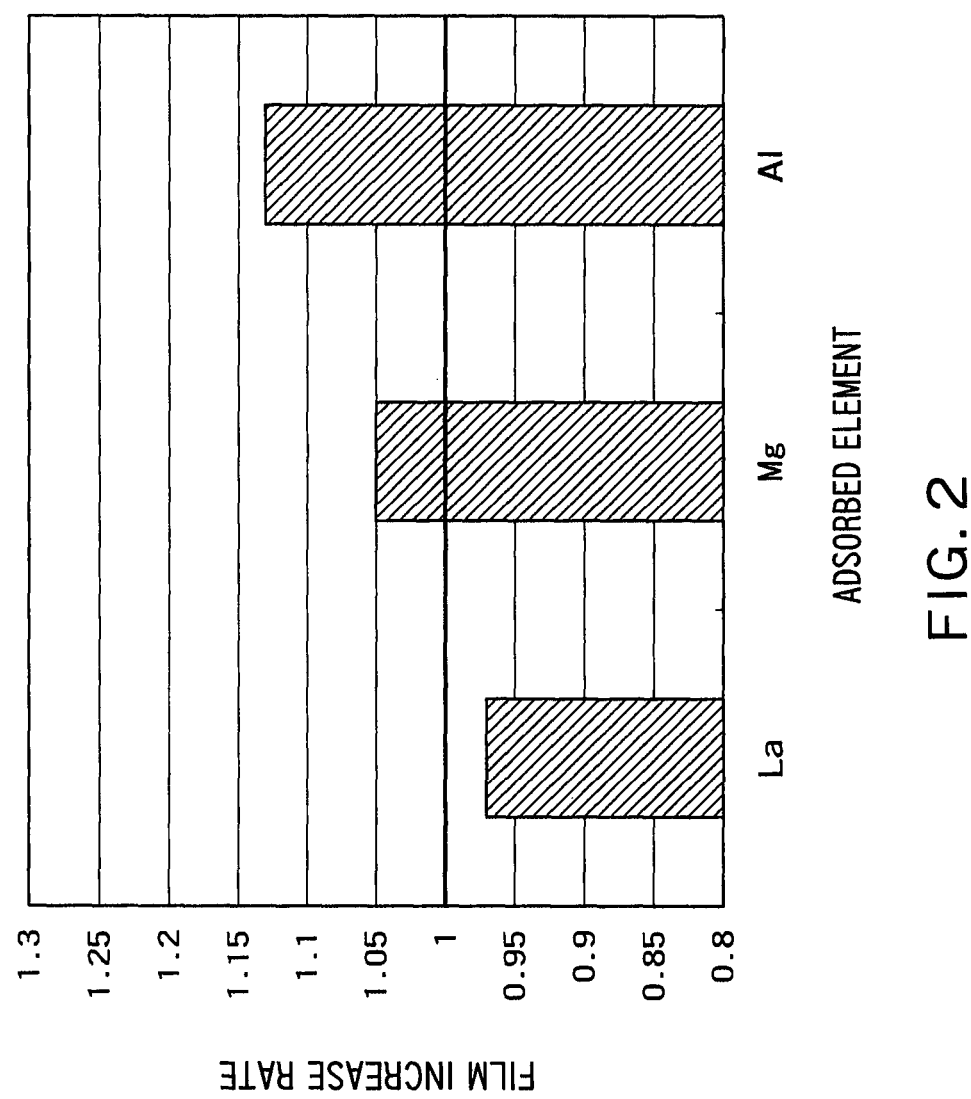
FIGS. 2 to 6 are diagrams for explaining the embodiment of the present invention.

The present inventors formed underlayer films containing a variety of atoms on the silicon substrate, and then formed silicon oxide films on the underlayer films, to uniquely evaluate the obtained silicon oxide films. FIG. 2 is one comparing film thicknesses of the silicon oxide films at the time of depositing the silicon oxide film on the underlayer films made up of a variety of atoms.

Specifically, a sample as a reference (sample having a film increase rate of 1) in FIG. 2 is one obtained by depositing a silicon oxide film on a silicon substrate by use of TEOS and ozone by the ALD method at a deposition temperature of 550° C. This silicon oxide film has a film thickness of 6 nm. Further, other samples are obtained by adsorbing lanthanum atoms, magnesium atoms and aluminum atoms respectively onto silicon substrates to deposit silicon oxide films on the same conditions as the conditions on which the above described silicon oxide film having a 6-nm film thickness was deposited, and film thicknesses of the obtained silicon oxide films are compared with the film thickness of the sample as the reference. It is to be noted that the film thickness of the silicon oxide film was measured by an electric method using a MIS (Metal-Insulator-Semiconductor) capacitor. It is found from this FIG. 2 that on the underlayer film containing aluminum atoms or magnesium atoms, a deposition rate of the silicon oxide film deposited thereon has increased.

Next, the present inventors made a comparison between a sample obtained by depositing the silicon oxide film directly on the silicon substrate and a sample obtained by forming an underlayer film that contains aluminum atoms on the silicon substrate and depositing a silicon oxide film thereon. Regarding such two samples, FIG. 3 shows the relation of the film thickness of the silicon oxide film with respect to deposition time for the silicon oxide film.

Figure 3:
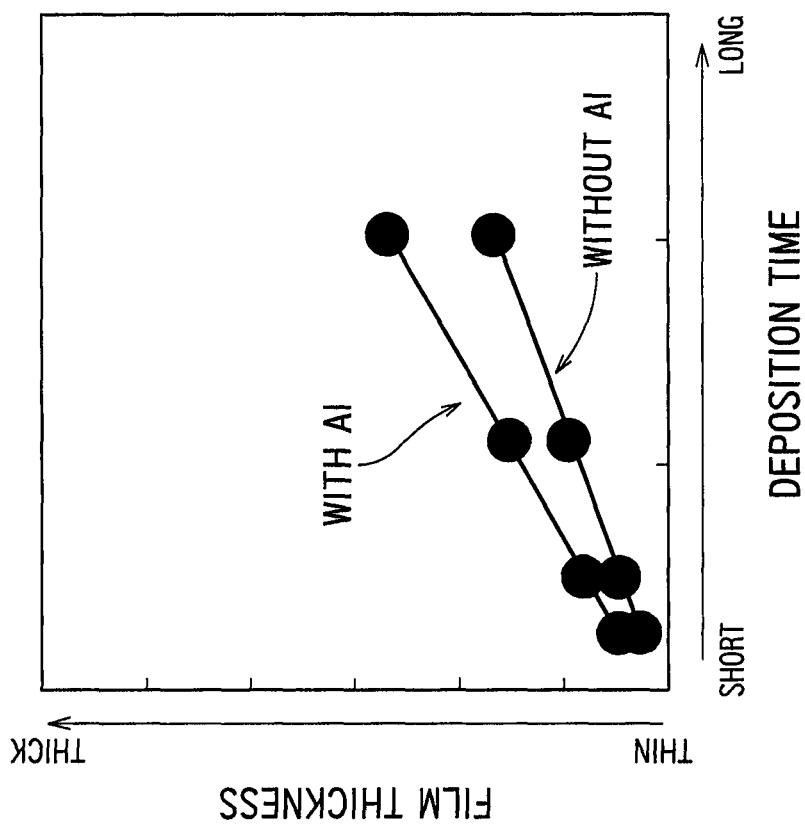

Specifically, the sample with aluminum in FIG. 3 is one obtained such that by use of TMA as an aluminum source, an underlayer film containing aluminum atoms with a concentration of not smaller than 1e12 atoms/cm$^2$ and not larger than 1e16 atoms/cm$^2$ is formed on a silicon substrate by the ALD method on conditions of a deposition temperature being from a room temperature to 500° C. and deposition pressure being from 0.1 Torr to 10 Torr, and by use of TEOS as a silicon source, a silicon oxide film is deposited on the underlayer film by the CVD method on conditions of a flow rate being from 10 sccm to 2000 sccm, a deposition pressure being from 0.1 Torr to 760 Torr and a deposition temperature being from 600° C. to 750° C. On the other hand, a sample without aluminum in FIG. 3 is one obtained by depositing a silicon oxide film directly on a silicon substrate on similar conditions to those of the sample with aluminum in FIG. 3. It should be noted that the film thickness of the silicon oxide film was measured by an optical method. It is also found from this FIG. 3 that deposition on the underlayer film containing aluminum atoms leads to an increase in deposition rate of the silicon oxide film.

Further, the present inventors studied how the deposition temperature has an influence on the deposition rate of the silicon oxide film at the time of depositing the silicon oxide film on the underlayer film containing aluminum atoms.

Figure 4:
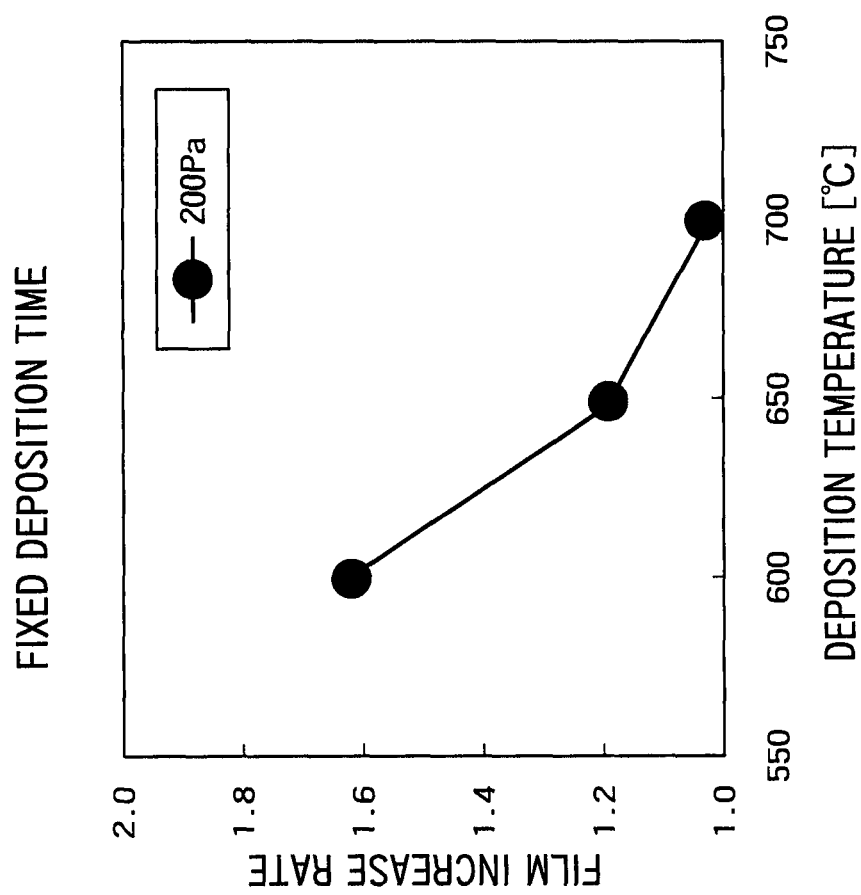

FIG. 4 is a diagram showing a rate of increase in deposition rate with respect to a deposition temperature based on fixed deposition pressure (Pa=200 Pa) and fixed deposition time. Conditions for creating samples are similar to the case of FIG. 3, and a sample as a reference (sample having a film increase rate of 1) is one obtained by depositing a silicon oxide film directly on a silicon substrate as in FIG. 2. It is found from this FIG. 4 that the lower the deposition temperature, the larger the increase in deposition rate of the silicon oxide film due to the underlayer film. That is, in the present embodiment, it is possible to increase the deposition rate of the silicon oxide film without significantly raising the deposition temperature.

According to the present embodiment, forming the underlayer film that contains atoms of aluminum or the like and depositing the silicon oxide film thereon can increase the deposition rate of the silicon oxide film since atoms of aluminum or the like serve as a catalyst. It is thus possible to obtain a desired silicon oxide film in a smaller amount of time, and further to reduce the time for manufacturing the semiconductor device. Further, it is possible to increase the deposition rate of the silicon oxide film without significantly raising the deposition temperature, so as to avoid degradation of another film due to heating, and the like.

Additionally, according to the present embodiment, deposition by means of a silicon source without the OH group can avoid occurrence of many dangling bonds in the silicon oxide film, so as to obtain a silicon oxide film of good quality. Moreover, according to the present embodiment, since the silicon oxide film is deposited by the ALD method or the CVD method, it is possible to suppress an amount of carbon in the silicon oxide film as compared with one formed by the application method. Furthermore, it is possible to use an inexpensive silicon source, so as to suppress cost for manufacturing the semiconductor device.

Additionally, according to the present embodiment, forming the underlayer film that contains atoms of aluminum or the like and depositing the silicon oxide film can give a silicon oxide film having more favorable insulating characteristics, that is, a reduced leak current. This will be detailed below.

The present inventors studied how insulating characteristics of a silicon oxide film changes in the case of forming an underlayer film that contains aluminum atoms and depositing the silicon oxide film thereon. What was thereby obtained is a diagram shown in FIG. 5, indicating the relation of a current density of the silicon oxide film with respect to an applied electric field.

Figure 5:
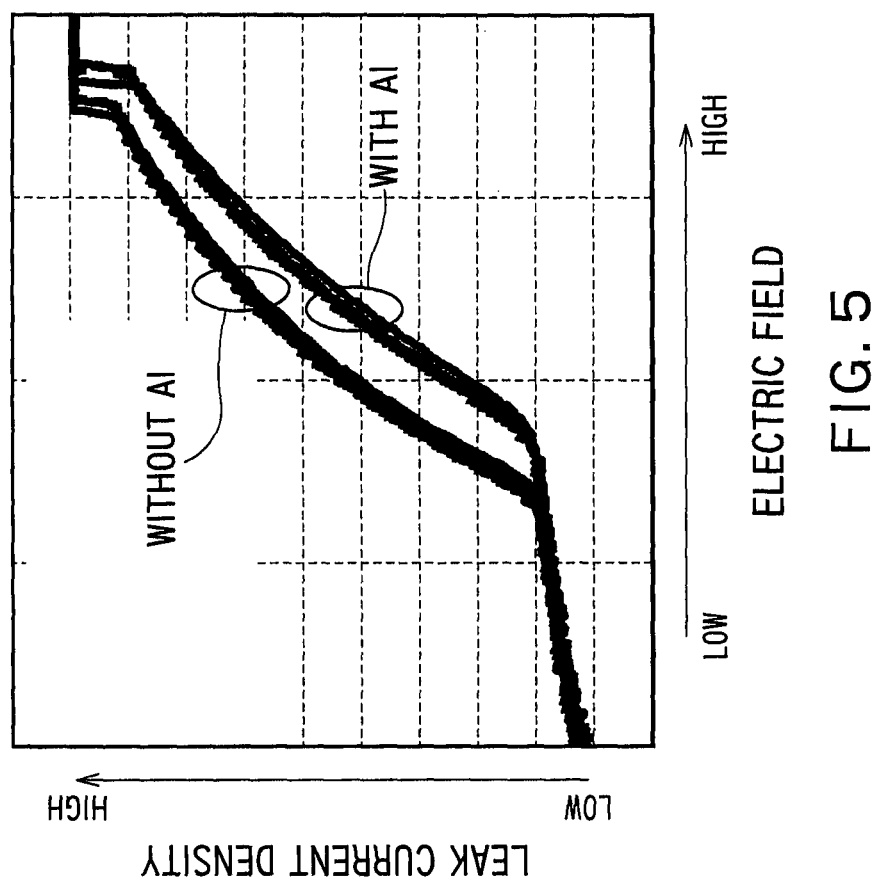

Specifically, a sample without aluminum in FIG. 5 is a MIS capacitor obtained by depositing the silicon oxide film on the silicon substrate, and a sample with aluminum in FIG. 5 is a MIS capacitor obtained by adsorbing aluminum atoms to between the silicon substrate and the silicon oxide film. Conditions for creating these samples are similar to the case of FIG. 3, and the concentration of aluminum atoms was set so as to be 1e14 atoms/cm$^2$. Then, FIG. 5 is a result obtained by injecting electrons from the silicon substrate side to the silicon oxide film in these samples. In this FIG. 5, a horizontal axis indicates an applied voltage, and a vertical axis indicates an exponentially converted leak current density. It became apparent from this FIG. 5 that in the MIS capacitor with aluminum, the leak current has been reduced by the order of about 1.5 digits as compared with the MIS capacitor without aluminum.

Figure 6:
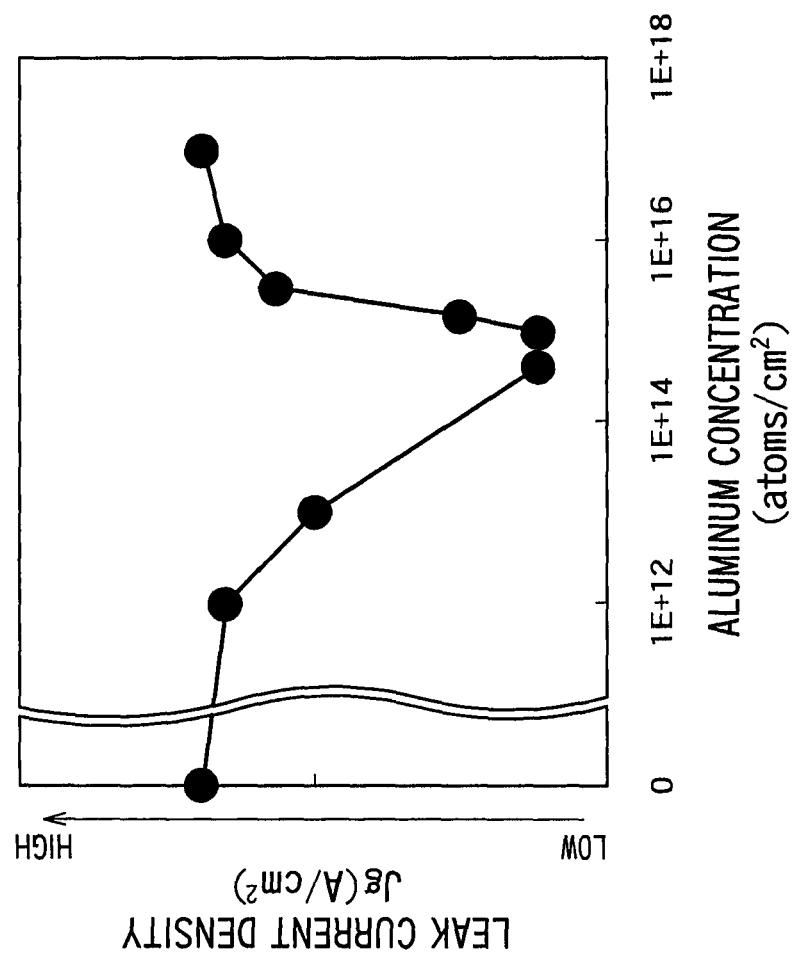

Further, the present inventors studied the relation between the concentration of aluminum atoms and the leak current, to obtain such results as shown in FIG. 6. It became apparent that the effect of the reduction in leak current is obtained in the case of the concentration of aluminum atoms being not smaller than 1e12 atoms/cm$^2$ and not larger than 1e16 atoms/cm$^2$.

The present inventors presume that the reason for reduction in leak current of the silicon oxide film by forming the underlayer film that contains atoms of aluminum or the like and depositing the silicon oxide film thereon is that a barrier height of the silicon oxide film is modulated and increased. This will be detailed below. Herein, a description will be provided taking a case as an example where the underlayer film made up of an aluminum oxide film is formed.

In the case of depositing the silicon oxide film on the aluminum oxide film as the underlayer film, that is, in the case of laminating different oxide films, oxygen densities in the interface are different. Then, oxygen ions shift to the low-concentration oxygen density side so as to alleviate the difference in oxygen density in this interface. Further, when the underlayer film is made thin, bonds therein are weak and the oxygen ions are thus considered to shift with ease. When the oxygen ions shift in this manner, an electric dipole is generated in the interface formed by the different oxide films. Further, this electric dipole modulates an energy band structure of the oxide film. Specifically, when the electric dipole is generated such that a positive charge is arranged in the oxide film as the electron injecting side and a negative charge is arranged in the oxide film located on the opposite side to the electron injecting side, the energy band is modulated to the side to increase a barrier against electrons, whereby an electron tunneling rate decreases and the leak current thus decreases. In addition, the present inventors have made certain that in the case of depositing the silicon oxide film on the underlayer film made up of the aluminum oxide film by means of photoelectron spectroscopy, the barrier height (electric barrier) becomes higher by the order of 0.2 eV to 0.5 eV as compared with the case of depositing the silicon oxide film directly on the semiconductor substrate.

Further, also in the case of this underlayer film being the metal film, the nitride film, the boride film, the sulfide film or the like, the surface of the underlayer film is oxidized at the time of deposition of the silicon oxide film on the underlayer film, and hence the interface formed by the different oxide films as described above exists. The electric dipole is thus generated in the interface, thereby to increase the barrier height. Hence the leak current decreases.

Further, in the case of using atoms of alkaline earth metal such as beryllium, magnesium, calcium, strontium or barium in place of aluminum atoms in place of aluminum atoms, a larger electric dipole is thought to be generated since an atom with a smaller atomic number has a higher oxygen holding density. Therefore an atom with a smaller atomic number is preferably used as an atom to be used for formation of the underlayer film. Moreover, in the case of using boron atoms, a larger electric dipole is thought to be generated since a boron atom has a smaller atomic weight and a higher oxygen density than an aluminum atom. However, since boron atoms are apt to be dispersed in the silicon oxide film, it is preferable to avoid dispersion of boron atoms for generating the electric dipole, and for example, it is preferable to deposit the silicon oxide film at a low temperature or use an underlayer film made up of a boron nitride film.

Consequently, according to the present embodiment, forming the underlayer film that contains atoms of aluminum or the like and depositing the silicon oxide film thereon can not only increase the deposition rate, but also give a silicon oxide film having more favorable insulating characteristics, that is, a reduced leak current.

Further, the present inventors made certain if formation of the underlayer film as thus described will not cause occurrence of a new problem in the semiconductor device. Specifically, measurement was performed to see how aluminum atoms are distributed with respect to a cross section of a sample obtained by forming an underlayer film made up of an aluminum oxide film on a silicon substrate, depositing a silicon oxide film thereon, and further forming a silicon nitride film or a silicon oxide film thereon. The measurement revealed that aluminum atoms remain existent between the silicon substrate and the silicon oxide film even after a variety of processes, and it was thus made certain that no influence is exerted on another film.

It is to be noted that in the present embodiment, when the film thickness of the silicon oxide film 4 to be obtained is not smaller than 100 nm, in order to sufficiently exert the effect of the underlayer film 3 to increase the deposition rate of the silicon oxide film 4, formation of the underlayer film 3 and deposition of the silicon oxide film 4 may be repeatedly performed until the silicon oxide film 4 has a desired film thickness, for example, in such a manner that deposition of the silicon oxide film 4 is once stopped at each time of depositing the silicon oxide film 4 into a predetermined film thickness, the underlayer film 3 is again formed thereon and the silicon oxide film 4 with the predetermined film thickness is formed thereon.

Further, the present embodiment may be implemented in a batch furnace capable of simultaneously processing a plurality of semiconductor substrates or in a sheet furnace capable of processing a single semiconductor substrate.

Modified Example of First Embodiment

Examples of a modified example of the present embodiment include one in which a silicon nitride film is formed and an underlayer film containing aluminum atoms is then formed thereon. Forming the silicon nitride film as thus described can more reliably give the effect of the electric dipole. The modified example of the present embodiment will be described using FIGS. 7A to 7D. It is to be noted that in a description of the modified example of the present embodiment below, a portion having the same configuration and function as in the first embodiment is provided with the same numeral as in the first embodiment, and a description thereof will be omitted.

Figure 7A:
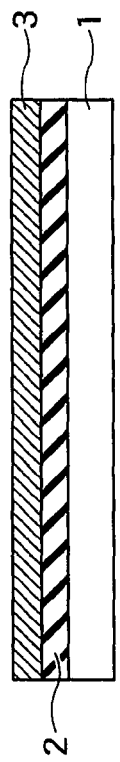
FIGS. 7A to 7D are views for explaining a method for manufacturing a semiconductor device according to a modified example of the first embodiment.

First, as shown in FIG. 7A, similarly to the first embodiment, the semiconductor substrate 1, which is for example made up of a silicon substrate, is prepared.

Figure 7B:
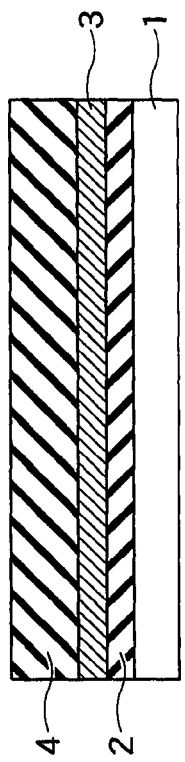

Further, as shown in FIG. 7B, a silicon oxide film 2 is formed on the semiconductor substrate 1. This silicon nitride film 2 is preferably a conformal film having a film thickness of not smaller than 0.5 nm, for example. Further, a method for forming the silicon nitride film 2 is not particularly restricted, but a known method may be used. It should be noted that, with the silicon nitride film 2 having a high dielectric constant, a leak current can be suppressed by the film thickness being made large. However, for example in the case of intending to deposit the silicon oxide film 4 placed between two electrodes, the silicon nitride film 2 is preferably not made to have a large film thickness when a coupling capacitance between the two electrodes is wished to be suppressed since the coupling capacitance increases with increase in thickness of the silicon nitride film 2.

Figure 7C:
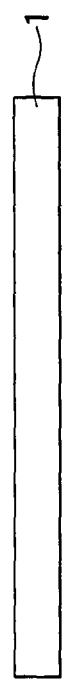

Then, similarly to the first embodiment, the underlayer film 3 containing aluminum atoms is formed on the surface of the silicon nitride film 2, and further the oxidizing agent is introduced into the furnace, to obtain the underlayer film 3 made up of the aluminum oxide film as shown in FIG. 7C.

Figure 7D:
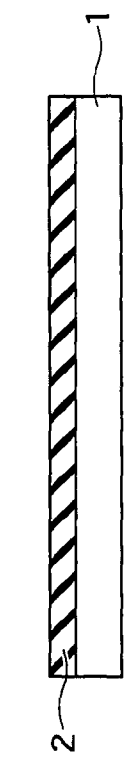

Next, as shown in FIG. 7D, similarly to the first embodiment, the silicon oxide film 4 is deposited on the underlayer film 3.

According to this modified example, forming the silicon nitride film 2 and then forming thereon the underlayer film 3 containing aluminum atoms allows the effect of the electric dipole to be reliably obtained. This will be detailed below.

For example, when the underlayer film 3 made up of the aluminum oxide film is formed on the silicon substrate 1 and the silicon oxide film 4 is deposited thereon, the surface of the silicon substrate 1 is oxidized by oxygen contained in the aluminum oxide film 3 during the formation process, leading to generation of a silicon oxide film (hereinafter referred to as a silicon-substrate-side silicon oxide film) between the silicon substrate 1 and the underlayer film 3. In such a case, an electric dipole (hereinafter referred to as a parasitic electric dipole) is also generated in the interface between the silicon-substrate-side silicon oxide film and the underlayer film 3, but a direction of this parasitic electric dipole is opposite to that of an electric dipole (hereinafter referred to as a desired electric dipole) in the interface between the underlayer film 3 and the silicon oxide film 4. For this reason, the effect of the desired parasitic electric dipole may be cancelled by the parasitic electric dipole.

However, according to this modified example, forming the silicon nitride film 2 on the silicon substrate 1 can avoid oxidation of the silicon substrate 1, and can further avoid generation of the parasitic electric dipole in the interface between the silicon-substrate-side silicon oxide film and the underlayer film 3. It is therefore possible to more reliably obtain the effect of the desired parasitic electric dipole generated in the interface between the underlayer film 3 and the silicon oxide film 4, so as to obtain the silicon oxide film 4 having favorable insulating characteristics.

Second Embodiment

The present embodiment will be described using FIGS. 8A to 8E. Although a description will be provided here taking, as an example, formation of a hard mask made up of a silicon oxide film in the method for manufacturing a semiconductor device, the present invention is not restricted to this, but can be applied to other semiconductor devices and the like, and to sites thereof. It is to be noted that in a description of the present embodiment below, a portion having the same configuration and function as in the first embodiment is provided with the same numeral as in the first embodiment, and a description thereof will be omitted. In addition, FIGS. 8A to 8E are ones corresponding to cross sections along a word line in a memory cell area of a semiconductor memory device.

Figure 8A:
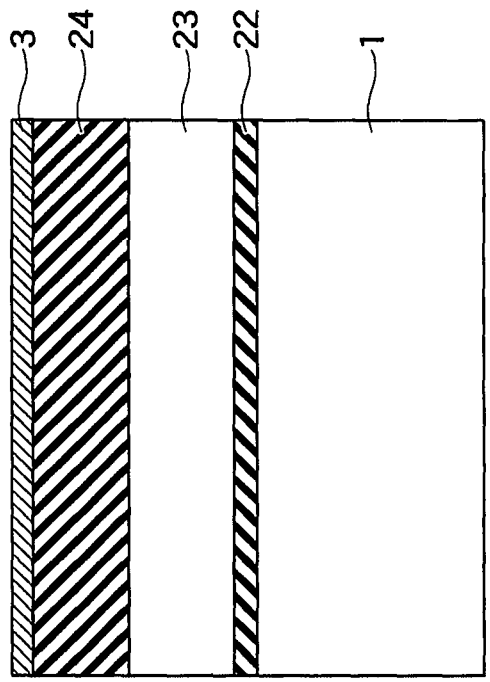

First, as shown in FIG. 8A, on a p-type silicon substrate 1 (or one obtained by forming a p-type well on an n-type silicon substrate), a gate insulating film 22 is formed so as to have a film thickness of the order of 1 nm to 15 nm, for example. A charge accumulation film (floating gate, FG) 23 is formed thereon by the CVD method so as to have a film thickness of the order of 5 nm to 50 nm, for example. Further, a silicon nitride film 24 is formed thereon by the CVD method so as to have a film thickness of the order of 50 nm to 200 nm, for example.

Figure 8B:
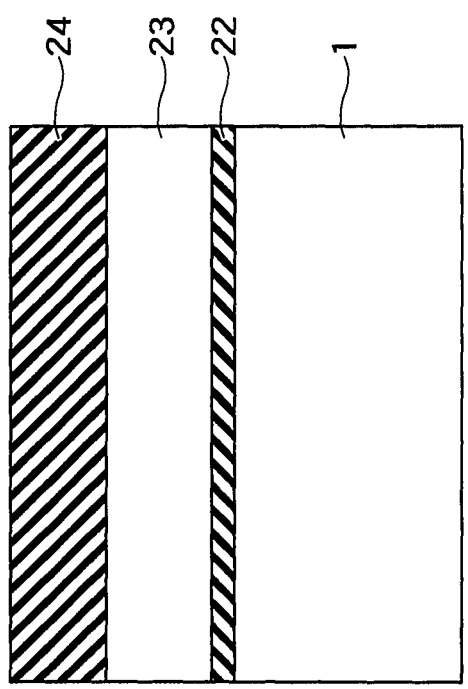

Next, the underlayer film 3 containing aluminum atoms is formed on the silicon nitride film 24. Similarly to the first embodiment, aluminum atoms can be adsorbed for example by introducing TMA into a decompression furnace. A concentration of aluminum atoms at this time is, for example, set to 1e14 atoms/cm². Subsequently, after elimination of TMA inside an atmosphere and purging by means of inert gas, ozone is then introduced into the chamber to oxidize the adsorbed aluminum atoms so that the underlayer film 3 made up of the aluminum oxide film as shown in FIG. 8B is obtained. In addition, similarly to the first embodiment, this underlayer film 3 is not restricted to the film containing aluminum atoms and the oxide film.

Figure 8C:
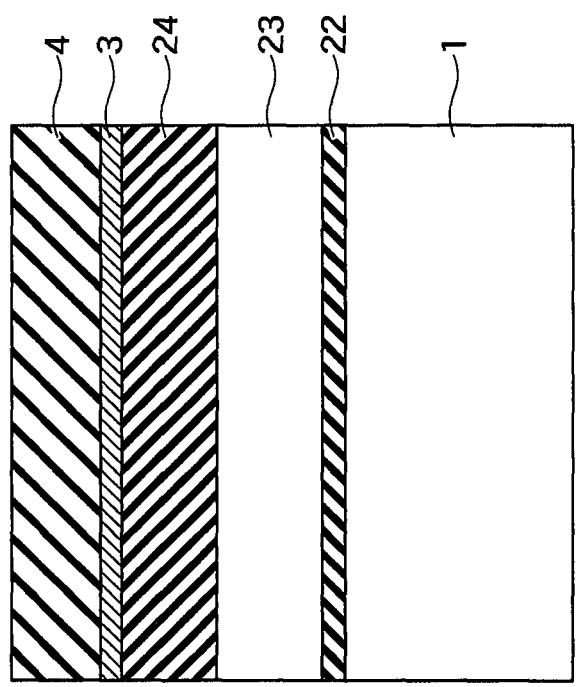

Then, as shown in FIG. 8C, similarly to the first embodiment, TEOS is introduced into the furnace, and on the underlayer film 3, the silicon oxide film 4 is deposited so as to have a film thickness of the order of 50 nm to 400 nm, for example. This is performed by the CVD method under a condition of a deposition temperature of 700° C. As thus described, depositing the silicon oxide film 4 on the underlayer film 3 containing aluminum atoms can double the deposition rate of the silicon oxide film 4 from about 3 nm/min in the case of nonexistence of the underlayer film 3 to about 6 nm/min.

Figure 8D:
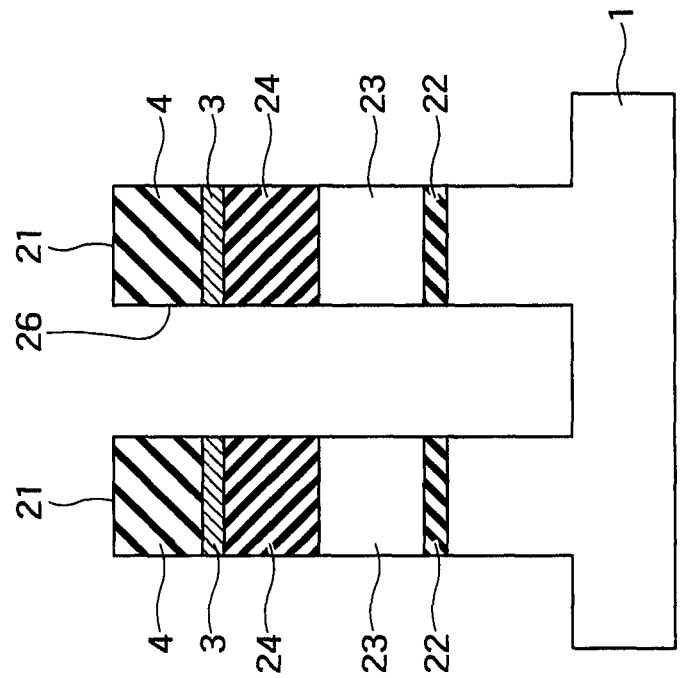

Subsequently, a photoresist (not shown) is applied onto the formed silicon oxide film 4, and patterning is performed on a photoresist by exposure drawing. Then, the silicon oxide film 4 is etched using a photoresist as a mask, and patterning is thereby performed on the silicon oxide film 4. Further, the photoresist is removed, and the underlayer film 3, the silicon nitride film 24, the charge accumulation film 23, the gate insulating film 22 and the silicon substrate 1 are etched using the patterned silicon oxide film 4 as a hard mask, to form an element isolation trench 26 and a memory cell 21, as shown in FIG. 8D.

Moreover, as shown in FIG. 8E, an element isolation insulating film 27 is formed so as to have a film thickness of the order of 200 nm to 1500 nm, for example, to fill the element isolation trench 26.

According to the present embodiment, forming the underlayer film 3 that contains aluminum atoms and depositing the silicon oxide film 4 as the hard mask thereon can increase the deposition rate of the silicon oxide film 4. It is thus possible to obtain a desired silicon oxide film 4 in a smaller amount of time, and further to reduce the time for manufacturing the semiconductor device. Further, according to the present embodiment, depositing the silicon oxide film 4 by means of a silicon source without the OH group can avoid occurrence of many dangling bonds in the silicon oxide film 4, so as to obtain the silicon oxide film 4 of good quality. Therefore, a pattern with good accuracy is formed on the silicon oxide film 4.

Third Embodiment

Figure 9:
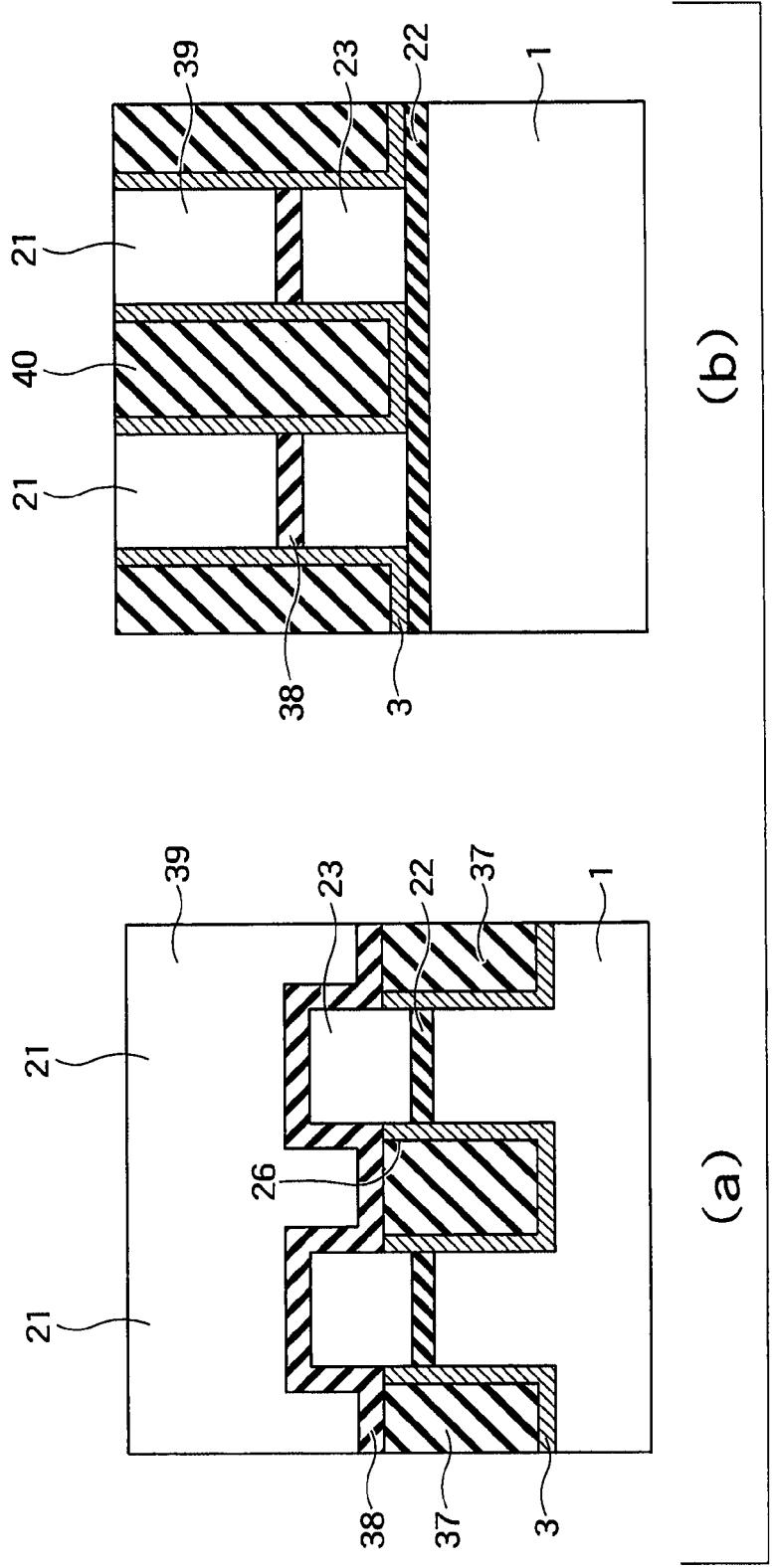
FIGS. 9 (a) and 9 (b) are sectional views for explaining a semiconductor memory device according to a third embodiment.

The present embodiment will be described using FIGS. 9 (*a*) and 9 (*b*). Although a description will be provided here taking as an example the case of application to formation of an element isolation insulating film 37 and an interlayer insulating film 40, the present invention is not restricted to this, but can be applied to other semiconductor devices and the like, and to sites thereof. It is to be noted that in a description of the present embodiment below, a portion having the same configuration and function as in the first and second embodiments is provided with the same numeral as in the first and second embodiments, and a description thereof will be omitted. FIGS. 9 (*a*) and 9 (*b*) are sectional views of a memory cell area of the semiconductor memory device. Specifically, FIG. 9 (*a*) is a sectional view of the semiconductor memory device cut along a word line, and FIG. 9 (*b*) is a sectional view of the semiconductor memory device cut along a bit line.

Specifically, the semiconductor memory device of the present embodiment has the semiconductor substrate 1 and a plurality of memory cells 21 formed on the semiconductor substrate 1, as shown in FIG. 9 (*a*). The memory cells 21 are formed by lamination of the gate insulating film 22 and the charge accumulation film 23, and each memory cell 21 is separated from one another by the element isolation trench 26 formed on the semiconductor substrate 1. The element isolation insulating film 37 made up of a silicon oxide film is embedded in the element isolation trench 26, and further, the underlayer film 3 made up of an aluminum oxide film is provided between the memory cells 21 and the element isolation insulating film 37, the aluminum oxidation film having been obtained by adsorbing aluminum atoms and performing oxidation processing on the atoms. Similarly to the first embodiment, this underlayer film 3 is not restricted to the film containing aluminum atoms and the oxide film, but may also be one containing atoms of either boron or alkaline earth metal. However, the underlayer film 3 is preferably an insulating film such as an oxide film or a nitride film in order to electrically insulate each layer constituting the memory cell 21. Further, similarly to the first embodiment, the concentration of aluminum atoms in the underlayer film 3 is preferably a surface density of not smaller than 1e12 atoms/cm² and not larger than 1e16 atoms/cm². With regard to the film thickness of the underlayer film 3, it is to be noted that a width of the element isolation trench 26 has become smaller in accordance with the pattern of the semiconductor memory device becoming finer. In order to form the element isolation insulating film 37 on the element isolation trench 26 more reliably even in such a case, the underlayer film 3 is preferably a thinner one, and the film thickness of the underlayer film 3 is preferably on the order of 0.001 nm to 1 nm, for example. Then, an interelectrode insulating film 38 is formed so as to cover the top surface of the memory cells 21 and the top surface of the element isolation insulating film 37, and a control electrode film 39 is formed thereon.

Further, as shown in FIG. 9 (b), the semiconductor memory device of the present embodiment has the semiconductor substrate 1 and a plurality of memory cells 21 formed on the semiconductor substrate 1. The interelectrode insulating film 38 and the control electrode film 39 are formed on the memory cell 21, and adjacent memory cells 21 are separated by the interlayer insulating film 40 made up of a silicon oxide film. Further, the underlayer film 3 made up of an aluminum oxide film obtained by adsorbing aluminum atoms and performing oxidation processing is provided between the interlayer insulating film 40 and the memory cell 21. Similarly to the first embodiment, this underlayer film 3 is not restricted to the film containing aluminum atoms and an oxide film, but for the purpose of electrically insulating each layer constituting the memory cell 21, the underlayer film 3 is preferably an insulating film such as an oxide film or a nitride film. Further, the concentration of aluminum atoms in the underlayer film 3 is preferably similar to that of the underlayer film 3 between the memory cell 21 and the element isolation insulating film 37.

Figure 10:
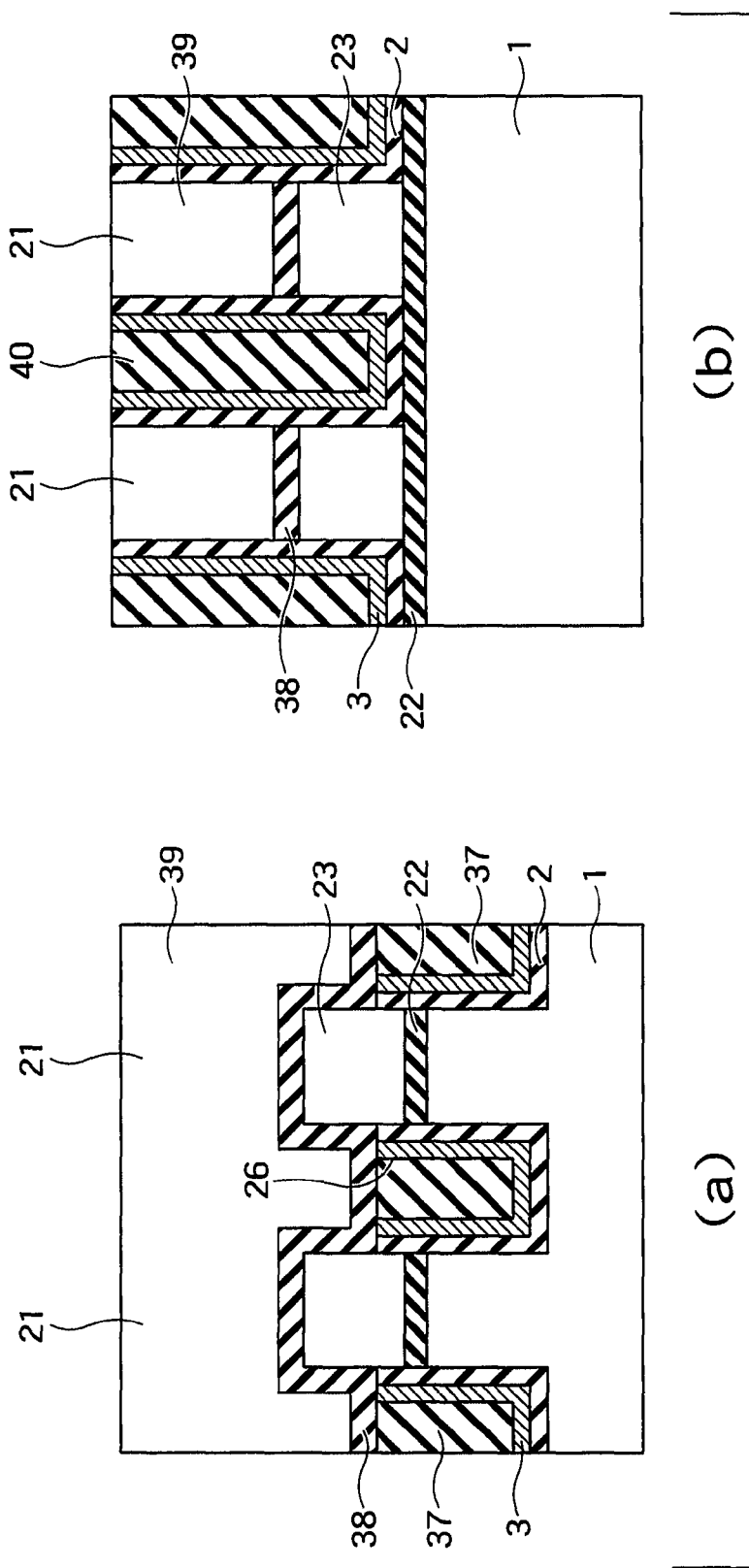
FIGS. 10 (a) and 10 (b) to 12 (a) and 12 (b) are sectional views for explaining a semiconductor memory device according to a modified example of the third embodiment.

It is to be noted that in the present embodiment, similarly to the modified example of the first embodiment, a silicon nitride film 2 may be formed between the memory cell 21 and the underlayer film 3 as shown in FIGS. 10 (a) and 10 (b).

Moreover, also in the present embodiment, the case of forming one layer of lamination of the underlayer film 3 and the element isolation insulating film 37 or the interlayer insulating film 40 is not restrictive, but a plurality of such lamination may be formed.

As for the method for manufacturing a semiconductor device, a known method for manufacturing a semiconductor memory device can be employed, but at the time of formation of the element isolation insulating film 37 and the interlayer insulating film 40, the underlayer film 3 is formed and the an element isolation insulating film 37 and the interlayer insulating film 40 which are made up of the silicon oxide films are formed thereon by means of a similar method to those of the embodiments as thus described.

According to the present embodiment, forming the underlayer film 3 that contains aluminum atoms is formed and forming thereon the an element isolation insulating film 37 and the interlayer insulating film 40, which are made up of silicon oxide films, can increase the deposition rates of the element isolation insulating film 37 and the interlayer insulating film 40, and can thus reduce the time for manufacturing the semiconductor memory device. Further, according to the present embodiment, depositing the element isolation insulating film 37 and the interlayer insulating film 40 by means of the silicon source without the OH group can avoid occurrence of many dangling bonds in the element isolation insulating film 37 and the interlayer insulating film 40, so as to obtain the element isolation insulating film 37 and the interlayer insulating film 40 of good quality. Since the films are formed by the ALD method or the CVD method, amounts of carbon in the element isolation insulating film 37 and the interlayer insulating film 40 can be suppressed as compared with those of films formed by an application method. For example, in the present embodiment, amounts of carbon in the element isolation insulating film 37 and the interlayer insulating film 40 can be made not larger than $1e19$ atoms/cm$^3$.

Further, according to the present embodiment, since the electric dipole is generated in the interface between the underlayer film 3 and the element isolation insulating film 37 as well as the interlayer insulating film 40, insulating characteristics of the element isolation insulating film 37 and the interlayer insulating film 40 become more favorable so that a leak current between adjacent memory cells 21 can be suppressed.

Further, according to the present embodiment, as shown in FIG. 9 (b), providing the underlayer film 3 made up of the oxide film containing aluminum atoms or the like between the memory cell 21 and the interlayer insulating film 40 can improve rates of writing/deleting operations of the memory cell 21 (semiconductor memory device), so as to suppress a leak current.

Specifically, it is known that the oxide film, or the like, containing aluminum atoms or the like, tend to have a negative fixed charge. Therefore, in the present embodiment, electrons as carriers of an n-type diffusion layer move not in the vicinity of the surface of the semiconductor substrate 1 but in an area a little deeper than the surface of the semiconductor substrate 1, so as to react against a negative fixed charge in the underlayer film 3. Therefore, with the electrons becoming insusceptible to surface scattering, a mobility of the electrons improves, to allow improvement in speed of the writing/ deleting operations of the memory cell 21. Further, in the present embodiment, the electrons move not in the vicinity of the surface of the semiconductor substrate 1 but in the area a little deeper than the surface of the semiconductor substrate 1 due to the influence of the fixed charges of the underlayer film 3, whereby an electron moving range (electron moving channel) is restricted as compared with a memory cell not provided with the underlayer film 3. Hence it is possible to suppress a leak current between a source and a drain (not shown) of the memory cell 21. That is, according to the present embodiment, suppressing a lead current can prevent a decrease in length of a channel of the memory cell 21.

It is to be noted that in the present embodiment, provision of the underlayer film 3 both between the memory cell 21 and the element isolation insulating film 37 and between the memory cell 21 and the interlayer insulating film 40 as shown in FIGS. 9 (a) and 9 (b) is not restrictive, but the underlayer film 3 may provided either above.

Modified Example of Third Embodiment

Figure 11:
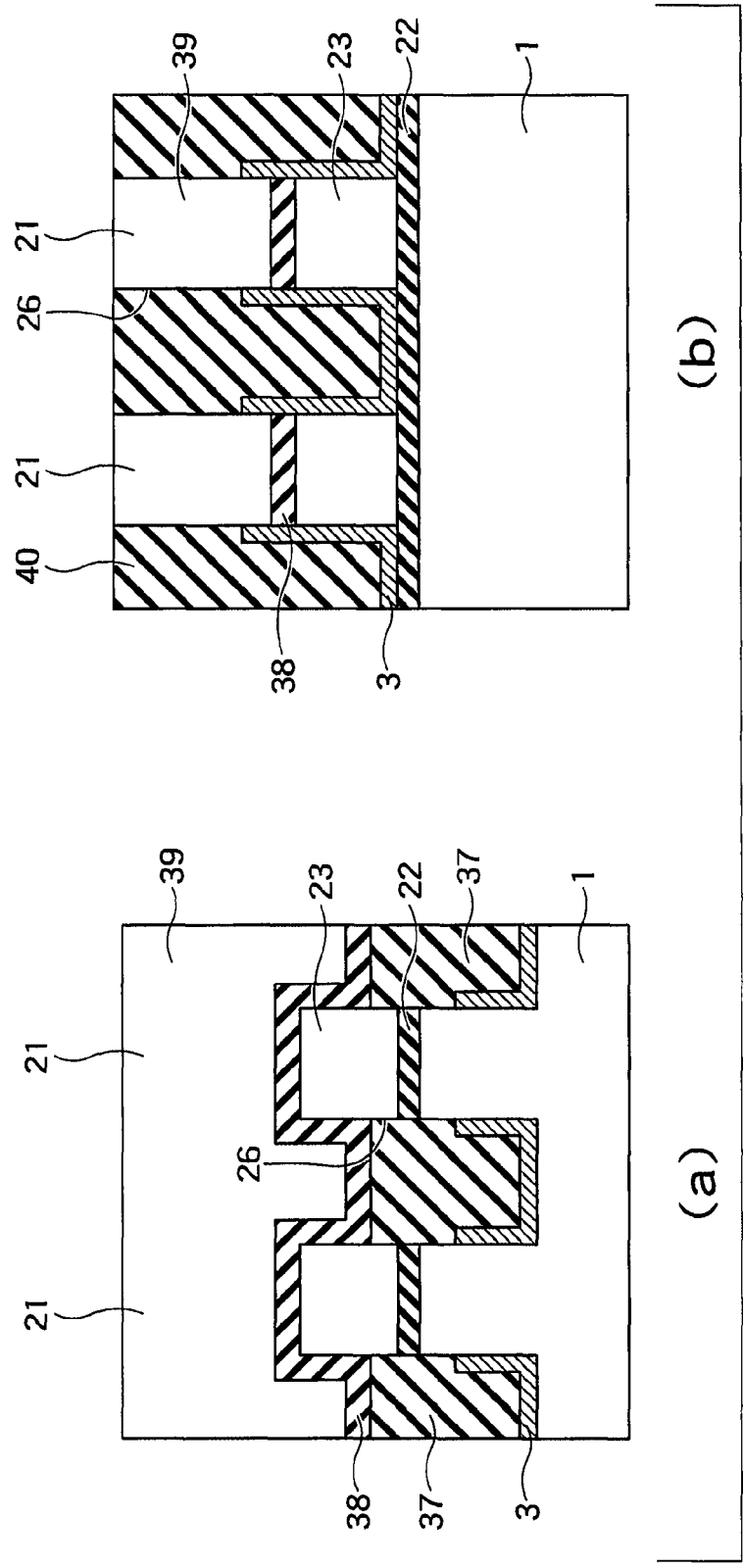

Examples of a modified example of the present embodiment include one obtained by selectively forming the underlayer film 3 on a lower part side wall of the element isolation trench 26, as shown in FIGS. 11 (a) and 11 (b). In such a manner, the element isolation insulating film 37 and the interlayer insulating film 40 can be formed in the element isolation trench 26 without generation of a void.

Specifically, as thus described, in the case of depositing the silicon oxide film on the underlayer film 3, a deposition rate of the silicon oxide film increases as compared with the case of depositing the silicon oxide film in a place without the underlayer film 3. The present invention is one making use of a difference in deposition rate of the silicon oxide film, that is, the silicon oxide film deposited on the lower part side wall of the element isolation trench 26 via the underlayer film 3 is formed early as compared with the silicon oxide film deposited on an upper part side wall of the element isolation trench 26, thereby preventing the upper part of the element isolation trench 26 from being blocked by the silicon oxide film in advance, so as to allow formation of the element isolation insulating film 37 and the interlayer insulating film 40, which are made up of the silicon oxide films, in the element isolation trench 26 without generation of a void.

Figure 12:
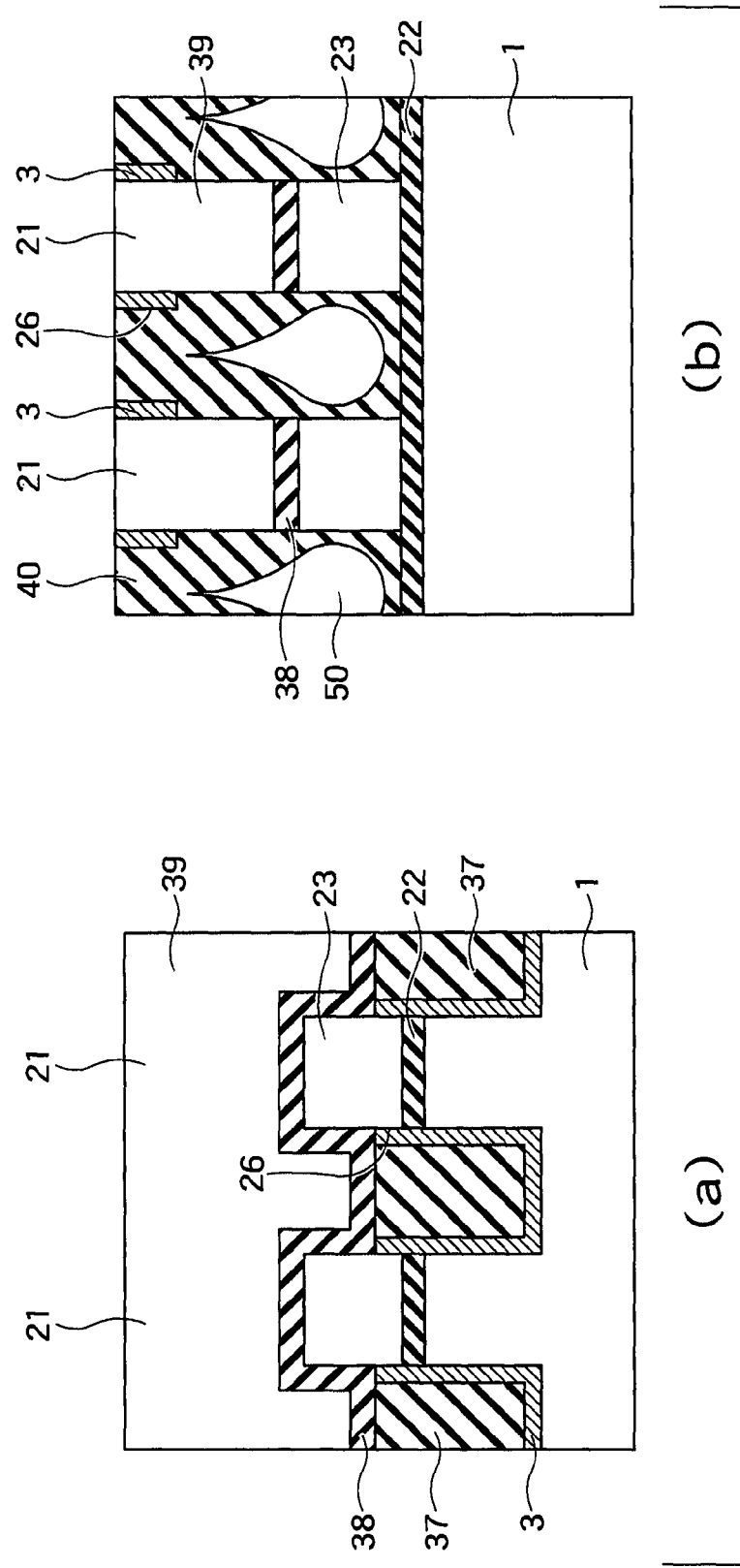

Further, examples of the modified example include one obtained by selectively forming the underlayer film 3 on the upper part side wall of the element isolation trench 26 between the adjacent memory cells 21 as shown in FIGS. 12 (a) and 12 (b). In such a manner, an air gap 50 can be efficiently formed in the element isolation trench 26. This modified example also makes use of a difference in deposition rate of the silicon oxide film due to the underlayer film 3, that is, the silicon oxide film deposited on the upper part side wall of the element isolation trench 26 is formed early as compared with the silicon oxide film deposited on an upper part side wall of the element isolation trench 26, and hence the lower part of the element isolation trench 26 is blocked by the silicon oxide film in advance, so as to allow formation of the air gap 50 in the lower part of the element isolation trench 26.

Fourth Embodiment

The present embodiment will be described using FIGS. 13A and 13B. Although a description will be provided here taking, as an example, wiring and an insulating film between wires in a semiconductor device, the present invention is not restricted to this, but can be applied to other semiconductor devices and the like, and to sites thereof. It is to be noted that in a description of the present embodiment below, a portion having the same configuration and function as in the embodiments as thus described is provided with the same numeral as in the embodiments as thus described, and a description thereof will be omitted.

Figure 13B:
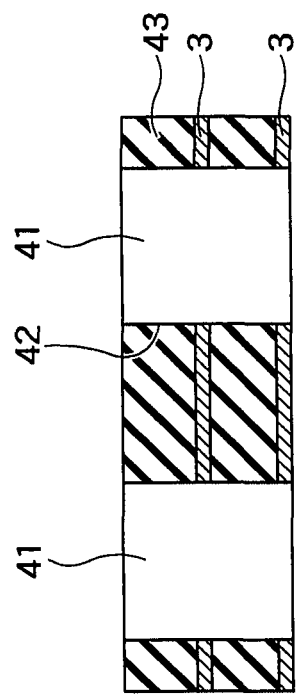
FIGS. 13A and 13B are sectional views of a semiconductor device according to a fourth embodiment.
Figure 13A:
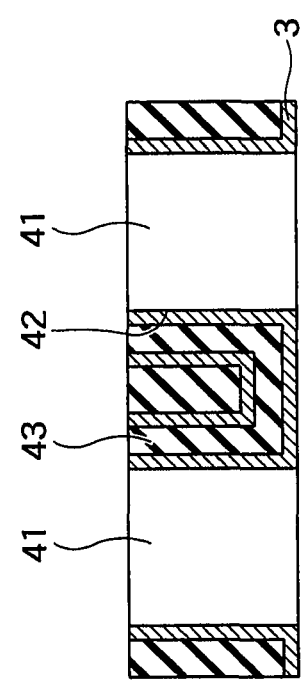

FIG. 13A is part of a cross section of the semiconductor device, and more specifically, the device is obtained by forming a metal plate on the semiconductor substrate 1, patterning the metal plate to form a groove 42 between a plurality of adjacent wires 41, and subsequently forming an insulating film 43 made up of a silicon oxide film so as to fill the groove 42. By means of a similar method to those of the embodiments as thus described, the underlayer film 3 made up of an aluminum oxide film obtained by adsorbing aluminum atoms and performing oxidation processing is provided on the bottom surface and the side wall of the groove 42 before filling of the groove 42, and an insulating film 43 made up of a silicon oxide film is formed so as to cover the underlayer film 3. Similarly to the embodiments as thus described, this underlayer film 3 is not restricted to the film containing aluminum atoms and an oxide film, but for the purpose of electrically insulating the adjacent wires 41, the underlayer film 3 is preferably an insulating film such as an oxide film or a nitride film. Further, the concentration of aluminum atoms in the underlayer film 3 is preferably similar to those in the embodiments as thus described. It is to be noted that, also in the present embodiment, the case of forming one layer of lamination of the underlayer film 3 and the insulating film 43 made up of the silicon oxide film is not restrictive, but a plurality of such lamination may be formed in the groove 42, as shown in FIG. 13A.

Further, FIG. 13B is part of a cross section of the semiconductor device, and more specifically, the device is obtained by forming the insulating film 43 on the semiconductor substrate 1, forming the groove 42 on the insulating film 43 in a place to be provided with the wire 41 and filling the groove 42 with a metal film to form the wire 41. By means of a similar method to those of the embodiments as thus described, the underlayer film 3 made up of an aluminum oxide film obtained by adsorbing aluminum atoms and performing oxidation processing is provided on the semiconductor substrate 1 before formation of the insulating film 43, and the insulating film 43 made up of a silicon oxide film is formed so as to cover the underlayer film 3. It should be noted that, also in the present embodiment, the case of forming one layer of lamination of the underlayer film 3 and the insulating film 43 made up of the silicon oxide film is not restrictive, but a plurality of such lamination may be formed as shown in FIG. 13B. In such a manner, the structures of the wire 41 and the insulating film 43 and the method for forming those can be variously modified.

According to the present embodiment, forming the underlayer film 3 that contains atoms of aluminum or the like and forming the insulating film 43 made up of the silicon oxide film thereon can increase the deposition rate of the insulating film 43. It is therefore possible to reduce the time for manufacturing the semiconductor device. Further, according to the present embodiment, since the electric dipole can be generated in the interface between the underlayer film 3 and the insulating film 43, insulating characteristics of the insulating film 43 can be made more favorable so as to suppress a leak current between adjacent wires 41.

Fifth Embodiment

The present embodiment will be described using FIGS. 14 (a) and 14 (b). Although a description will be provided here taking, as an example, a semiconductor memory device having a BiCS (Bit-Cost-Scalable) structure, the present invention is not restricted to this, but can be applied to other semiconductor devices and the like, and to sites thereof. It is to be noted that in a description of the present embodiment below, a portion having the same configuration and function as in the embodiments as thus described is provided with the same numeral as in the embodiments as thus described, and a description thereof will be omitted.

Figure 14:
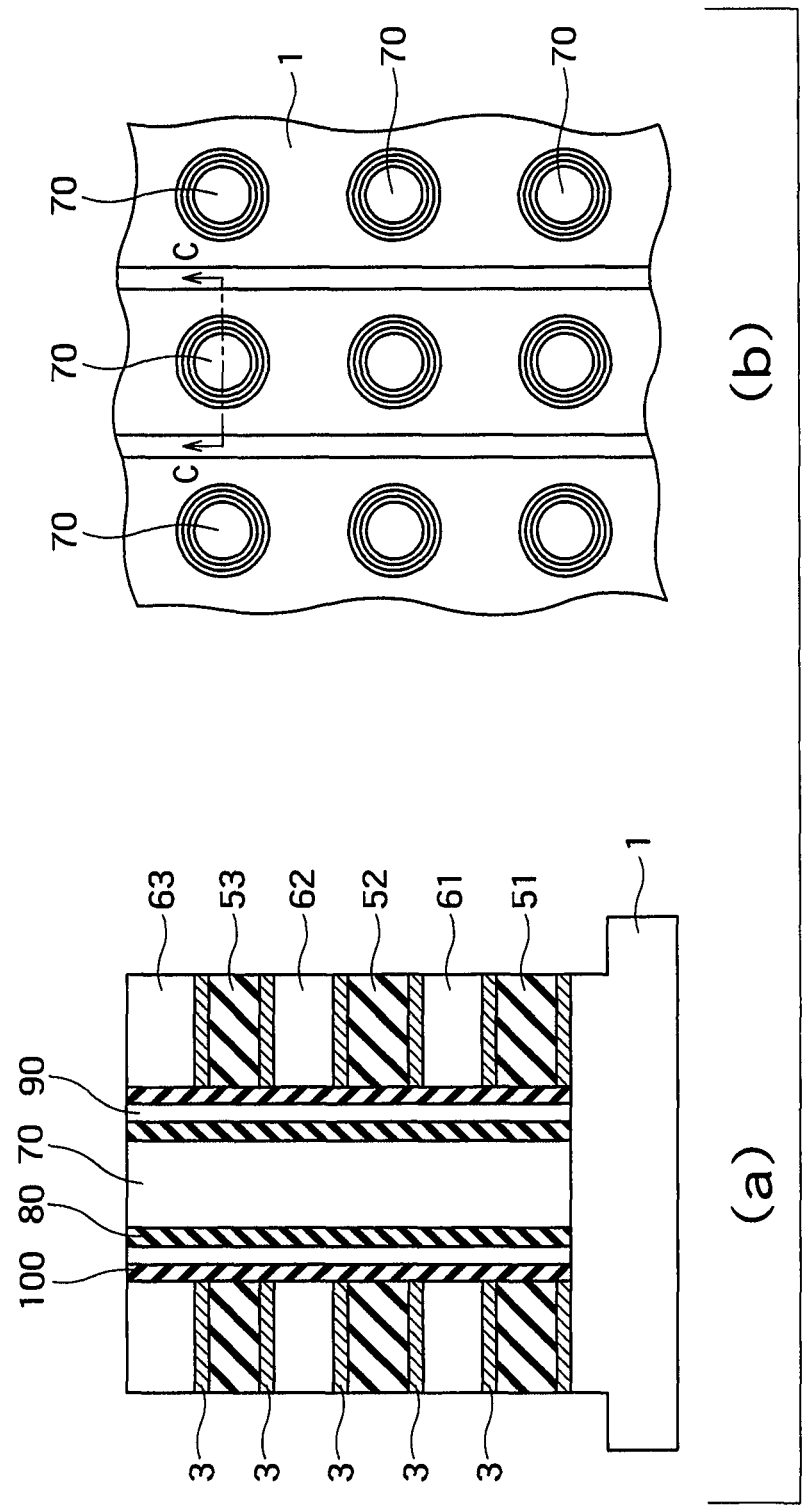
FIGS. 14 (a) and 14 (b) are views of semiconductor memory devices according to fifth and sixth embodiments.

As shown in a cross section of a semiconductor memory device of FIG. 14 (a), the BiCS structure is one obtained by forming a columnar silicon layer 70 on the silicon substrate 1 in a vertical direction to the surface of the silicon substrate 1. Specifically, as shown in a plan view of the semiconductor memory device of FIG. 14 (b), a plurality of columnar silicon layers 70 are formed on the silicon substrate 1 in a matrix form along an X direction and a Y direction orthogonal thereto. It is to be noted that in FIG. 14 (a), a cross section of only one silicon layer 70 is shown for facilitating understanding. That is, a C-C' cross section in FIG. 14 (b) corresponds to FIG. 14 (a).

In the present embodiment, as shown in FIG. 14 (a), a gate insulating film 80 made up, for example, of a silicon oxide film, a charge accumulation film 90 made up, for example, of a silicon nitride film, and a block insulating film 100 made up, for example, of a silicon oxide film are sequentially formed along a side wall surface of the silicon layer 70. Further, via these films, a lamination structure section, obtained by alternately laminating the interlayer insulating films 51, 52, 53 and control electrode films 61, 62, 63, is formed on the silicon substrate 1 so as to surround the columnar silicon layer 70. Specifically, the control electrode films 61, 62, 63 are formed horizontally to the surface of the silicon substrate 1, and in order to electrically insulating the control electrode films 61, 62, 63 from one another, the interlayer insulating films 51, 52, 53 are formed between the respective control electrode films. Herein, the interlayer insulating films 51, 52, 53 are made up of silicon oxide films, and control electrode films 61, 62, 63 are made up, for example, of polysilicon films. It is to be noted that, although FIG. 14 (*a*) shows the case of forming three layers of lamination of the interlayer insulating films and the control electrode films, the number of layers is not particularly restricted, and may for example be not smaller than four. Further, each of film thicknesses of the interlayer insulating films 51, 52, 53 and the control electrode films 61, 62, 63 is, for example, several tens of nm. Further, in the present embodiment, similarly to the embodiments as thus described, the underlayer films 3, each made up of an aluminum oxide film obtained by adsorbing aluminum atoms and performing oxidation processing, are provided between the interlayer insulating films 51, 52, 53 and the control electrode films 61, 62, 63. Similarly to the embodiments as thus described, providing the underlayer film 3 in such a manner can increase deposition rates of the interlayer insulating films 51, 52, 53 made up of the silicon oxide films. Similarly to the embodiments as thus described, this underlayer film 3 is not restricted to the film containing aluminum atoms and the oxide film, but may also be one of the oxide film, the nitride film, the boride film and the sulfide film containing atoms of either boron or alkaline earth metal. Further, similarly to the embodiments as thus described, the concentration of aluminum atoms in the underlayer film 3 is preferably a surface density of not smaller than 1e12 atoms/cm$^2$ and not larger than 1e16 atoms/cm$^2$. For example, when the underlayer film 3 is made up of an aluminum oxide film and intended to have a concentration of aluminum atoms being not smaller than 1e12 atoms/cm$^2$ and not larger than 1e16 atoms/cm$^2$, a film thickness of the underlayer film 3 is on the order of 0.001 nm to 1 nm.

As for manufacturing a semiconductor device of the present embodiment, a known method for manufacturing a semiconductor memory device can be employed, but at the time of forming the interlayer insulating films 51, 52, 53, the underlayer films 3 are formed and the interlayer insulating films 51, 52, 53 made up of the silicon oxide films are formed by the ALD method or the CVD method by means of a similar method to those of the embodiments as thus described.

According to the present embodiment, forming the underlayer film 3 that contains aluminum atoms and forming thereon the interlayer insulating films 51, 52, 53 made up of the silicon oxide films can increase the deposition rates of the interlayer insulating films 51, 52, 53. It is therefore possible to reduce the time for manufacturing the semiconductor device. Further, according to the present embodiment, since the electric dipole is generated in each interface between the underlayer film 3 and the interlayer insulating films 51, 52, 53, insulating characteristics of the interlayer insulating films 51, 52, 53 become more favorable so that a leak current between each of the control electrode films 61, 62, 63 can be suppressed. Moreover, since suppressing the leak current makes an electrical breakdown hard to occur, it is possible to form the interlayer insulating films 51, 52, 53 so as to be thin.

Figure 15:
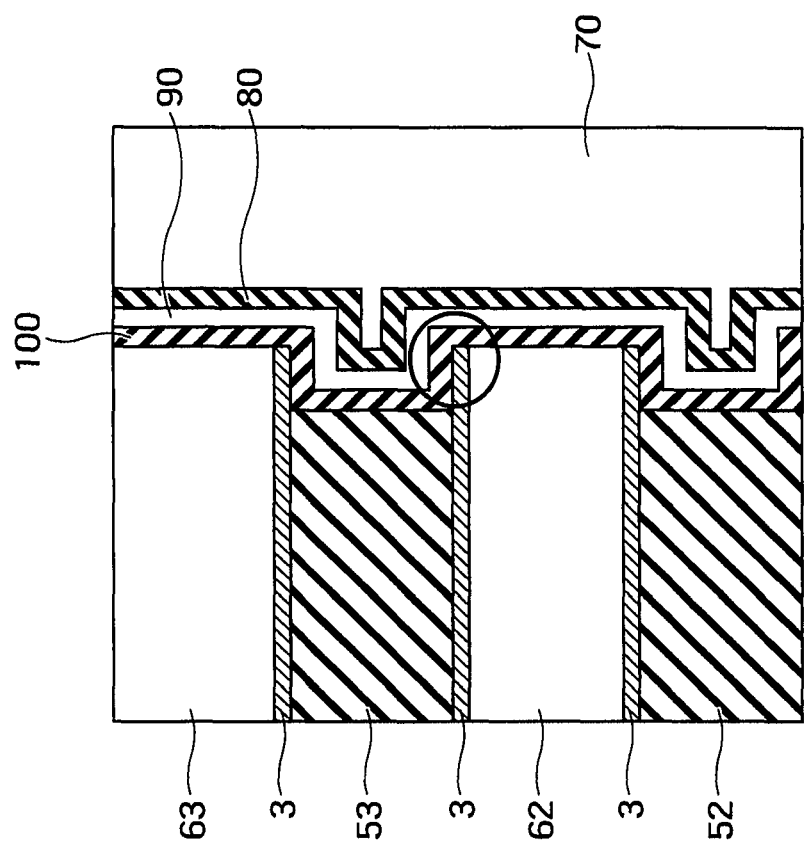
FIG. 15 is an expanded view of the semiconductor memory device of FIG. 14.

Specifically, the BiCS structure of the present embodiment is formed as follows. As shown in FIG. 15 obtained by expanding part of the BiCS structure, a side wall on the silicon layer 70 side of the lamination structure section made up of the control electrode films 61, 62, 63 and the interlayer insulating films 51, 52, 53 has a concavo-convex shape. In other words, the side surfaces of the control electrode films 61, 62, 63 protrude to the silicon layer 70 side as compared with the side surfaces of the interlayer insulating films 51, 52, 53. Further, the gate insulating film 80, the charge accumulation film 90, the block insulating film 100 and the silicon layer 70 are provided in between each of the protruding control electrode films 61, 62, 63. With such a structure formed, when an electric field is applied to the semiconductor memory device, an electric field concentration occurs on the end sections of the protruding control electrode films 61, 62, 63 (e.g. portion surrounded by a circle in FIG. 15), which may cause generation of a leak current. However, in the present embodiment, a place on which the electric field concentration may occur is covered by lamination made up of the underlayer film 3 and the block insulating film 100, and as described above, this lamination has favorable insulating characteristics so that generation of a leak current due to the electric field concentration can be suppressed.

Sixth Embodiment

The present embodiment is different from the fifth embodiment in using as the underlayer film 3 an insulating film having a higher dielectric constant than those of the interlayer insulating films 51, 52, 53. In such a manner, similarly to the fifth embodiment, it is possible to make insulating characteristics of the interlayer insulating films 51, 52, 53 more favorable in the semiconductor memory device having the BiCS structure, so as to suppress the leak current between each of the control electrode films 61, 62, 63. Further, since suppressing the leak current makes an electrical breakdown hard to occur, thereby to allow formation of the interlayer insulating films 51, 52, 53 having further small thicknesses.

The present embodiment will be described using FIGS. 14 (*a*) and 14 (*b*). It is to be noted that a portion having the same configuration and function as in the fifth embodiment is provided with the same numeral as in the fifth embodiment, and a description thereof will be omitted.

The semiconductor memory device of the present embodiment is shown in FIGS. 14 (*a*) and 14 (*b*) similarly to the fifth embodiment. Specifically, the underlayer film 3 is an insulating film having a higher dielectric constant than those of the interlayer insulating films 51, 52, 53 (dielectric constant of the silicon oxide film is on the order of 4), and examples of such an insulating film include an oxide film, an oxy-nitride film and a nitride film containing at least one of atoms of silicon, yttrium, hafnium, zirconium, lanthanum and the like, such as a silicon nitride film (dielectric constant of the order of 7), an yttrium oxide film (dielectric constant of the order of 16), a hafnium oxide film (dielectric constant of the order of 22), a zirconium oxide film (dielectric constant of the order of 22), a lanthanum oxide film (dielectric constant of the order of 22), a hafnium silicate film and a hafnium aluminate film. In addition, since a film containing not less than three elements, such as the hafnium silicate film or the hafnium aluminate film, has a dielectric constant that changes in accordance with compositions of those elements, in the case of forming the underlayer film 3 of such a film, the underlayer film 3 preferably has such a composition as to have a higher dielectric constant than those of the interlayer insulating films 51, 52, 53. Further, even the silicon oxy-nitride film can be used as long as having such a composition as to have a higher dielectric constant than those of the interlayer insulating films 51, 52, 53, or the silicon oxy-nitride film with a concentration of nitride therein changes along a film thickness direction may be used.

Further, the underlayer film 3 is preferably a conformal film covering the control electrode films 61, 62, 63 in order to obtain the effect of reducing a leak current. Specifically, when the underlayer film 3 is made up of the yttrium oxide film, the hafnium oxide film, the zirconium oxide film, the lanthanum oxide film, the hafnium silicate film, the hafnium aluminate film or the like, the underlayer film 3 preferably has a film thickness of 1 nm to 5 nm. Further, when the underlayer film 3 is made up of the silicon nitride film or the silicon oxynitride film, the underlayer film 3 preferably has a film thickness of 0.5 nm to 5 nm.

Figure 16:
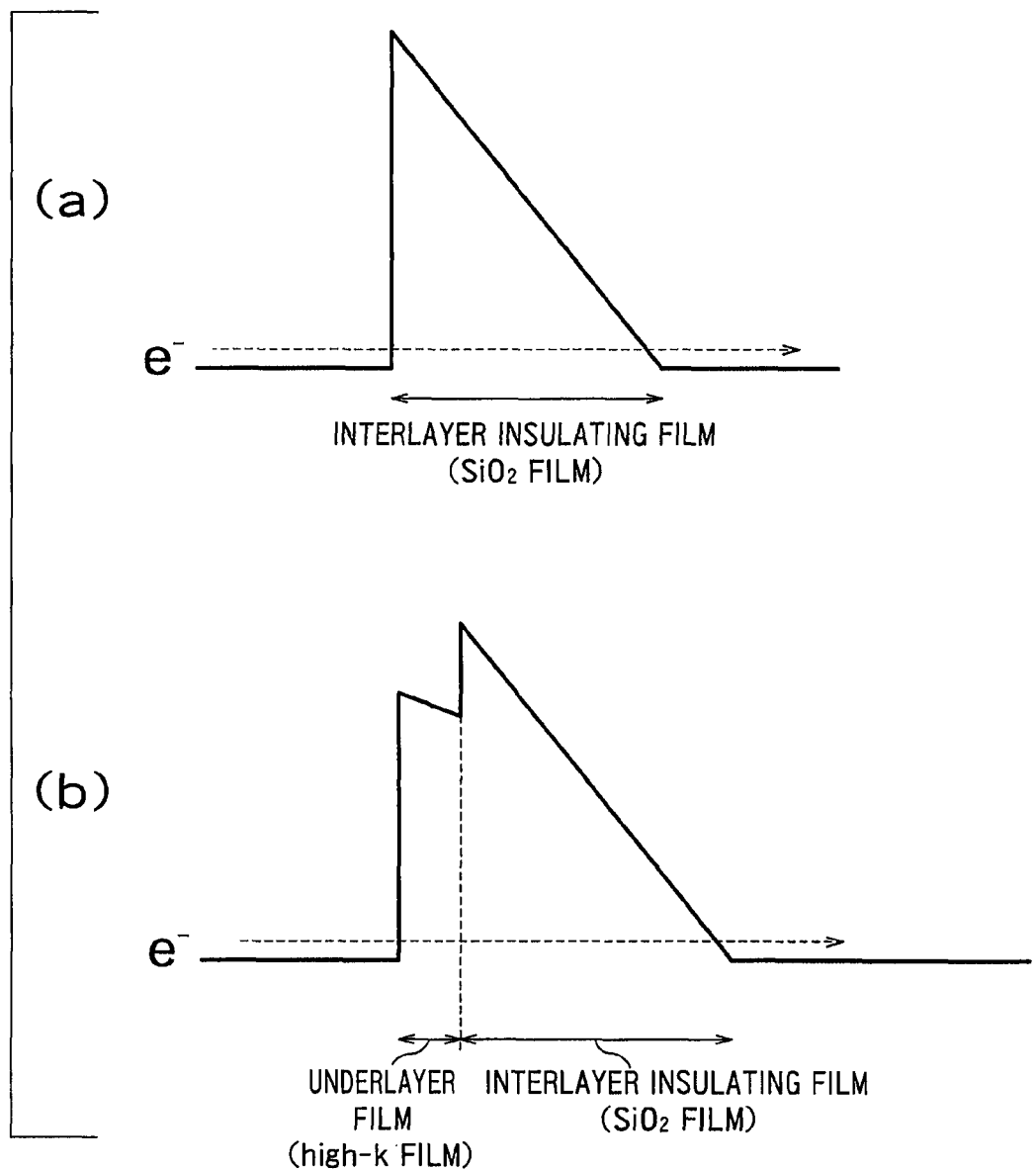
FIGS. 16 (a), 16 (b) and 17 are diagrams for explaining a semiconductor memory device according to a sixth embodiment.

According to the present embodiment, by use of an insulating film having a higher dielectric constant than dielectric constants of the interlayer insulating films 51, 52, 53 as the underlayer film 3 located between each of the interlayer insulating films 51, 52, 53 and each of the control electrode films 61, 62, 63, the leak current between each of the control electrode films 61, 62, 63 can be suppressed so as to avoid an electrical breakdown. This will be detailed as follows. In the present embodiment, an energy band structure between the control electrode films 61, 62, 63 and the interlayer insulating films 51, 52, 53 at the time of applying an electric field comes into a state as shown in FIG. 16 (b). In the semiconductor memory device of the present embodiment, electrons are injected from the control electrode films 61, 62, 63 toward the interlayer insulating films 51, 52, 53. However, as seen from this figure, since an insulating film having a higher dielectric constant than dielectric constants of the interlayer insulating films (silicon oxide films) 51, 52, 53 has been formed as the underlayer film 3, a barrier against electrons increases at the time of applying the electric field, to prevent the electrons from flowing in so that the leak current can be reduced. On the other hand, for the sake of comparison, FIG. 16 (a) shows an energy band structure between each of the control electrode films 61, 62, 63 and each of the interlayer insulating films 51, 52, 53 made up of the silicon oxide film in the case of non-existence of the underlayer film 3 (in the case of existence of only the interlayer insulating films 51, 52, 53 made up of the silicon oxide films). As seen by comparison with this energy band structure of FIG. 16 (a), the energy band structure of the present embodiment (FIG. 16 (b)) is formed with an insulating film having a higher dielectric constant than those of the interlayer insulating films 51, 52, 53 on the electron injecting side, and hence the barrier against the electrons is large.

That is, in the present embodiment, it is possible to suppress the leak current between each of the control electrode films 61, 62, 63, so as to avoid an electrical breakdown. Further, since the electrical breakdown becomes hard to occur, the interlayer insulating films 51, 52, 53 can be formed so as to have further small thicknesses.

Further, similarly to the fifth embodiment, according to the present embodiment, each of the end sections of the control electrode films 61, 62, 63, on which the electric field concentration may occur, on the side wall on the silicon layer 70 side of the lamination structure section in the BiCS structure is covered by lamination made up of the underlayer film 3 and the block insulating film 100, and it is thus possible to suppress generation of a leak current due to electric field concentration (cf. FIG. 15).

Figure 17:
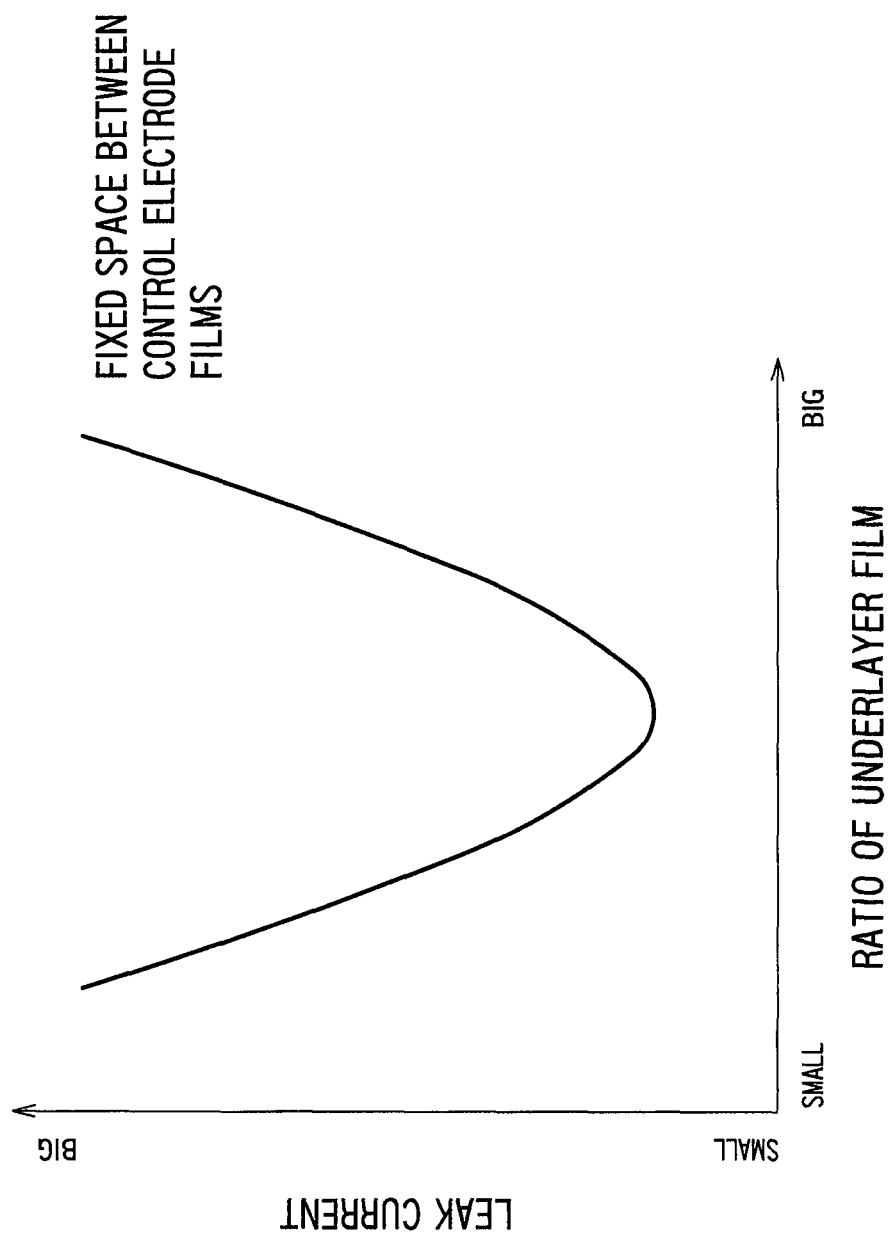

It should be noted that in a case where a space (physical distance) between each of the control electrode films 61, 62, 63 is already decided and the interlayer insulating films (silicon oxide films) 51, 52, 53 and the underlayer films 3 each made up of an insulating film having a higher dielectric constant than those of the interlayer insulating films 51, 52, 53 are inserted respectively between the control electrode films 61, 62, 63, a film thickness ratio between each of the interlayer insulating films 51, 52, 53 and the underlayer film 3 is preferably optimized according to the need. This will be detailed as follows. As described above, when the underlayer film 3 made up of the insulating film having a high dielectric constant exists, a barrier becomes large so that a leak current can be reduced. However, with increase in ratio of the underlayer film 3 made up of the insulating film having a high dielectric constant, the electric distance between each of the control electrode films 61, 62, 63 becomes closer. This adversely causes an increase in leak current. That is, the effect of the increase in leak current due to the electric distance becoming closer increases in accordance with an increase in ratio of the underlayer film 3 made up of the insulating film having a high dielectric constant, thereby to cancel the effect of providing the underlayer film 3 as thus described to increase the barrier and reduce a leak current. Therefore, due to such a relation of trade-off of the two effects, as shown in FIG. 17, an optimal value exists with respect to the ratio of the underlayer film 3, the value allowing the effect of reducing a leak current to be obtained. Accordingly, in the present embodiment, it is preferable to select an optimal ratio of the underlayer film 3, namely, an optimal film thickness of the underlayer film 3, in accordance with a material quality of the underlayer film 3, a space between each of the control electrode films 61, 62, 63, a voltage to be applied to the semiconductor memory device, or the like.

Seventh Embodiment

The present embodiment is different from the fifth and sixth embodiments in forming the underlayer film 3 in between each of the interlayer insulating films 51, 52, 53. In such a manner, similarly to the fifth and sixth embodiments, it is possible to make the insulating characteristics of the interlayer insulating films 51, 52, 53 more favorable in the semiconductor memory device having the BiCS structure, to suppress the leak current between each of the control electrode films 61, 62, 63. Moreover, since suppressing the leak current makes an electrical breakdown hard to occur, it is possible to form the interlayer insulating films 51, 52, 53 so as to be thin.

The present embodiment will be described using FIGS. 18 (a) and 18 (b). It is to be noted that in a description of the present embodiment below, a portion having the same configuration and function as in the fifth and sixth embodiments is provided with the same numeral as in the fifth and sixth embodiments, and a description thereof will be omitted.

Figure 18:
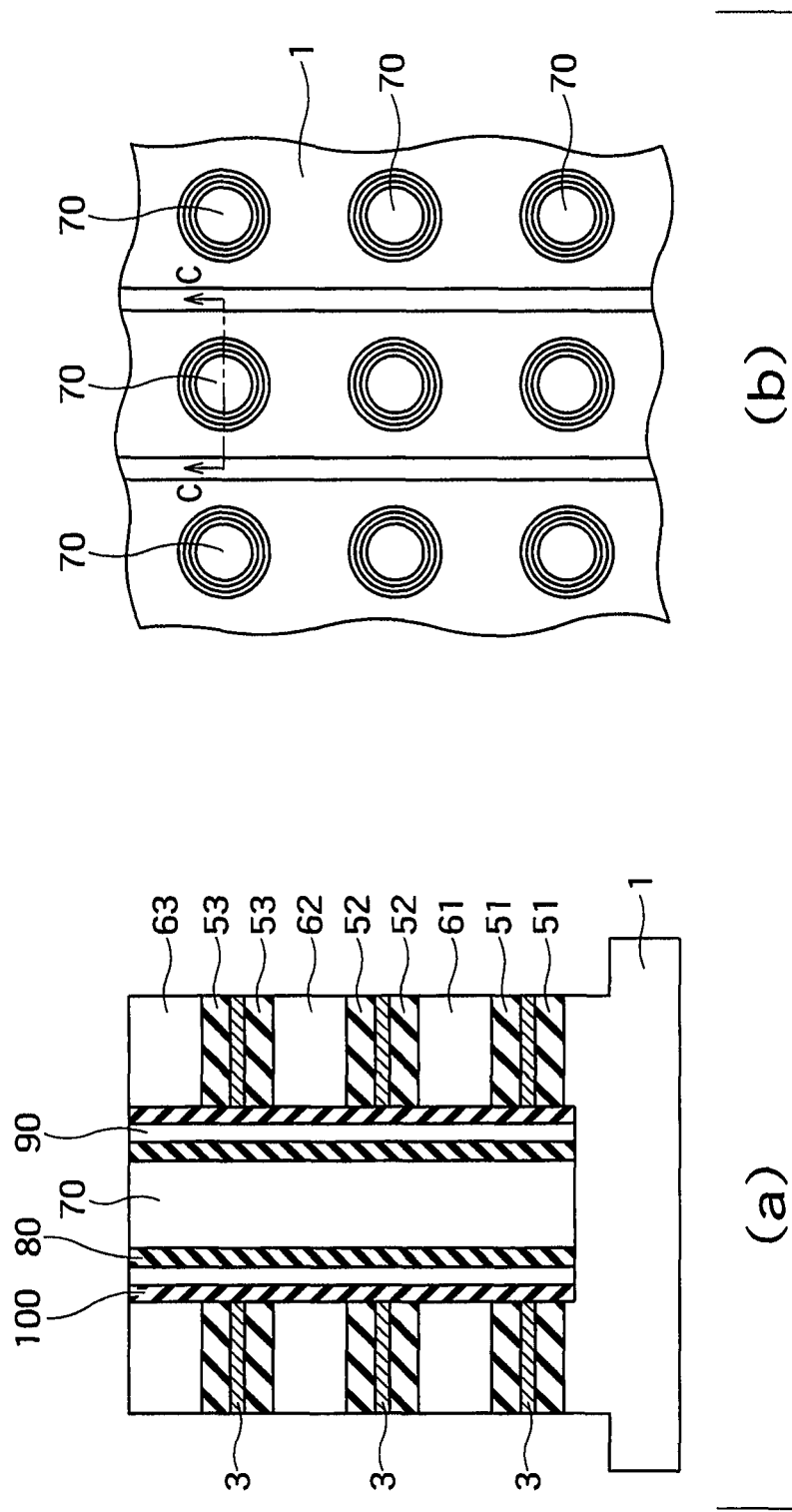
FIGS. 18 (a) and 18 (b) are views of a semiconductor memory device according to a seventh embodiment.

The present embodiment is shown in FIGS. 18 (a) and 18 (b). Specifically, as shown in FIG. 18 (a), the underlayer film 3 is formed in between each of the interlayer insulating films 51, 52, 53 made up of the silicon oxide films.

Similarly to the embodiments as thus described, the aluminum oxide film obtained by adsorbing aluminum atoms and performing oxidation processing can be used as the underlayer film 3. Further, similarly to the embodiments as thus described, this underlayer film 3 is not restricted to the film containing aluminum atoms and the oxide film, but may also be one of the oxide film, the nitride film, the boride film and the sulfide film containing atoms of either boron or alkaline earth metal. Moreover, similarly to the embodiments as thus described, the concentration of aluminum atoms in the underlayer film 3 is preferably a surface density of not smaller than 1e12 atoms/cm$^2$ and not larger than 1e16 atoms/cm$^2$.

Furthermore, similarly to the sixth embodiment, an insulating film having a higher dielectric constant than those of the interlayer insulating films (silicon oxide films) 51, 52, 53 can be used as the underlayer film 3. Examples thereof include an oxide film, an oxy-nitride film and a nitride film which contain atoms of at least one of silicon, yttrium, hafnium, zirconium and lanthanum, such as the silicon nitride film, the silicon oxy-nitride film, yttrium oxide film, the hafnium oxide film, the zirconium oxide film, the lanthanum oxide film, the hafnium silicate film and the hafnium aluminate film. In addition, similarly to the sixth embodiment, when the silicon oxy-nitride film is used as the underlayer film 3, the film may be one where a concentration of nitrogen in the silicon oxy-nitride film changes along a film thickness direction.

Further, the underlayer film 3 is preferably a conformal film covering the control electrode films 61, 62, 63 in order to obtain the effect of reducing a leak current. Specifically, when the underlayer film 3 is made up of the yttrium oxide film, the hafnium oxide film, the zirconium oxide film, the lanthanum oxide film, the hafnium silicate film, the hafnium aluminate film or the like, the underlayer film 3 preferably has a film thickness of 1 nm to 5 nm. Further, when the underlayer film 3 is made up of the silicon nitride film or the silicon oxy-nitride film, the underlayer film 3 preferably has a film thickness of 0.5 nm to 5 nm.

According the present embodiment, by forming a film containing aluminum or the like or an insulating film having a higher dielectric constant than dielectric constants of the interlayer insulating films 51, 52, 53 as the underlayer film 3 in between each of the interlayer insulating films 51, 52, 53 made up of the silicon oxide films, a leak current between each of the control electrode films 61, 62, 63 can be reduced so as to avoid an electrical breakdown. Further, since the electrical breakdown also becomes hard to occur, it is possible to form the interlayer insulating films 51, 52, 53 so as to be thin.

Specifically, when the film containing aluminum or the like is formed as the underlayer film 3, similarly to the first embodiment, the interface formed by different oxide films exists, leading to generation of an electric dipole in the interface, to cause an increase in barrier height. It is therefore possible to obtain the interlayer insulating films 51, 52, 53 each having more favorable insulating characteristics, namely a reduced leak current. Further, when the insulating film having a higher dielectric constant than those of the interlayer insulating films 51, 52, 53 is formed as the underlayer film 3, the barrier increases as in the sixth embodiment. It is therefore possible to obtain the interlayer insulating films 51, 52, 53 each having more favorable insulating characteristics, namely, a reduced leak current.

Further, in the present embodiment, part of leaked charges may flow into the underlayer film 3 at the time of writing or deleting in the semiconductor memory device. In such a case, since the barrier height is large in the interfaces between the underlayer film 3 and each of the interlayer insulating films 51, 52, 53, the flown-in charges are blocked in by the underlayer film 3. This increases a self-electric field in the underlayer film 3, which causes a further increase in barrier height of the interfaces between the underlayer film 3 and interlayer insulating films 51, 52, 53 so that a leak current can further be reduced.

It should be noted that in a case where a space (physical distance) between each of the control electrode films 61, 62, 63 is already decided, it is preferable to select an optimal ratio of the underlayer film 3, namely, an optimal film thickness of the underlayer film 3, in accordance with a material quality of the underlayer film 3, the space between each of the control electrode films 61, 62, 63, a voltage to be applied to the semiconductor memory device, or the like.

It is to be noted that each of the BiCS structures described in the fifth to seventh embodiment is not restricted to the above-described structure, and for example, the sequence of each film may be changed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor memory device, comprising:
a semiconductor substrate;
a columnar silicon layer extending in a vertical direction to the surface of the semiconductor substrate;
a gate insulating film, a charge accumulation film and a block insulating film formed along a side wall surface of the columnar silicon layer, respectively; and
a lamination structure section surrounding the columnar silicon layer via the gate insulating film, the charge accumulation film and the block insulating film,
wherein, in the a lamination structure section,
an interlayer insulating film and a control electrode film are alternately laminated in a horizontal direction to the surface of the semiconductor substrate in the lamination structure section, the interlayer insulating film being made up of a silicon oxide film, and
an underlayer film is provided between the interlayer insulating film and the control electrode film, the underlayer film containing atoms selected from the group consisting of aluminum, boron, alkaline earth metal, silicon, yttrium, hafnium, zirconium and lanthanum.

2. The semiconductor memory device according to claim 1, wherein the underlayer film is made of one of an oxide film, a nitride film, a boride film, a sulfide film and an oxy-nitride film.

3. The semiconductor memory device according to claim 1, wherein the atoms are atoms selected from the group consisting of aluminum, boron and alkaline earth metal, and the underlayer film contains the atoms with a concentration of not smaller than 1e12 atoms/cm$^2$ and not larger than 1e16 atoms/cm$^2$.

4. The semiconductor memory device according to claim 1, wherein the underlayer film is made up of a silicon nitride film or a silicon oxy-nitride film, and has a film thickness of 0.5 nm to 5 nm.

5. The semiconductor memory device according to claim 1, wherein the atoms are atoms selected from the group consisting of silicon, yttrium, hafnium, zirconium and lanthanum, and the underlayer film has a film thickness of 1 nm to 5 nm.

* * * * *